(12) United States Patent
Yang et al.

(10) Patent No.: US 12,426,394 B2
(45) Date of Patent: Sep. 23, 2025

(54) CMOS IMAGE SENSOR

(71) Applicant: TAIWAN SEMICONDUCTOR MANUFACTURING COMPANY, LTD., Hsinchu (TW)

(72) Inventors: Ming-Hsien Yang, Taichung (TW); Chun-Hao Chou, Tainan (TW); Kuo-Cheng Lee, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 412 days.

(21) Appl. No.: 18/110,843

(22) Filed: Feb. 16, 2023

(65) Prior Publication Data

US 2024/0105750 A1    Mar. 28, 2024

Related U.S. Application Data

(60) Provisional application No. 63/409,535, filed on Sep. 23, 2022.

(51) Int. Cl.
  *H01L 27/146*    (2006.01)
  *H10F 39/00*    (2025.01)
  *H10F 39/18*    (2025.01)

(52) U.S. Cl.
  CPC ......... *H10F 39/807* (2025.01); *H10F 39/182* (2025.01); *H10F 39/8053* (2025.01); *H10F 39/8063* (2025.01)

(58) Field of Classification Search
  CPC . H01L 27/14654–14656; H10F 39/807; H10F 39/182; H10F 39/8053; H10F 39/8063; H10F 39/024; H10F 39/199
  See application file for complete search history.

(56) References Cited

U.S. PATENT DOCUMENTS

| | | | |
|---|---|---|---|
| 6,850,278 B1* | 2/2005 | Sakurai | H04N 25/59 348/E3.018 |
| 7,319,242 B2* | 1/2008 | Shimizu | G02B 3/0056 257/98 |
| 7,446,294 B2* | 11/2008 | Lin | H10F 39/8063 250/214 R |
| 7,821,559 B2* | 10/2010 | Kishi | H04N 25/623 348/308 |

(Continued)

*Primary Examiner* — Jarrett J Stark
(74) *Attorney, Agent, or Firm* — STUDEBAKER BRACKETT PLLC

(57) ABSTRACT

A CMOS image sensor includes PDAF pixels distributed in an array of image pixels in plan view. Each PDAF pixel includes m×m binned photodiodes, a PDAF color filter overlying the binned photodiodes and laterally surrounded by a first isolation structure, and a PDAF micro-lens overlying the PDAF color filter. A first horizontal distance between a center of the PDAF color filter and a center of the binned photodiodes varies depending on a location of the PDAF pixel in plan view in the CMOS image sensor. Additionally, the first isolation structure includes a first low-n dielectric grid, a second low-n dielectric grid underlying the first low-n dielectric grid, and a metal grid enclosed by the second low-n dielectric grid. The second low-n dielectric grid includes a filler dielectric material different from a second low-n dielectric grid material. Thus, quantum efficiency and uniformity of the CMOS image sensor are improved.

20 Claims, 20 Drawing Sheets

(56) References Cited

U.S. PATENT DOCUMENTS

| | | | | |
|---|---|---|---|---|
| 8,049,289 B2* | 11/2011 | Park | .................... | H10F 39/8063 257/E31.127 |
| 9,372,286 B2* | 6/2016 | Li | .................... | B29D 11/00384 |
| 10,728,475 B2* | 7/2020 | Yanagita | ............... | H10F 39/813 |
| 10,741,599 B2* | 8/2020 | Yanagita | ............... | H10F 39/8067 |
| 10,840,280 B2* | 11/2020 | Tomekawa | ............ | H10F 39/8023 |
| 11,563,050 B2* | 1/2023 | Asatsuma | ............... | H04N 25/70 |
| 11,721,774 B2* | 8/2023 | Yang | .................... | H10F 39/18 257/431 |
| 12,136,643 B2* | 11/2024 | Lim | .................... | H10F 39/8063 |
| 2004/0096124 A1* | 5/2004 | Nakamura | ............ | H04N 25/778 348/E3.019 |
| 2005/0078377 A1* | 4/2005 | Li | .................... | B29D 11/00278 359/619 |
| 2005/0110093 A1* | 5/2005 | Altice, Jr. | ............... | H10F 39/813 348/E3.018 |
| 2008/0211945 A1* | 9/2008 | Hong | .................... | H04N 23/84 348/294 |
| 2008/0266434 A1* | 10/2008 | Sugawa | ................. | H04N 25/78 348/308 |
| 2008/0290382 A1* | 11/2008 | Hirota | .................... | H10F 39/199 348/294 |
| 2011/0076001 A1* | 3/2011 | Iwasaki | ................. | H04N 23/672 396/114 |
| 2011/0121162 A1* | 5/2011 | Murata | ................. | H04N 25/771 250/214 P |
| 2011/0175981 A1* | 7/2011 | Lai | .................... | H04N 25/585 348/46 |
| 2011/0215223 A1* | 9/2011 | Unagami | ................ | H10F 39/15 257/E27.159 |
| 2011/0228149 A1* | 9/2011 | Naruse | .................... | H04N 25/585 348/E5.091 |
| 2012/0086845 A1* | 4/2012 | Enomoto | .......... | H10F 39/80373 438/57 |
| 2012/0217601 A1* | 8/2012 | Miyanami | ............ | H10F 39/811 257/E31.127 |
| 2012/0262616 A1* | 10/2012 | Sa | ........................ | H04N 25/575 348/311 |
| 2014/0253767 A1* | 9/2014 | Kato | .................... | H04N 25/134 257/432 |
| 2014/0264685 A1 | 9/2014 | Cheng et al. | | |
| 2015/0084144 A1* | 3/2015 | Suzuki | .................... | H04N 25/76 438/70 |
| 2016/0276396 A1* | 9/2016 | Tayanaka | ............ | H10F 39/8037 |
| 2017/0099422 A1* | 4/2017 | Goma | .................... | H04N 25/79 |
| 2018/0115727 A1* | 4/2018 | Yanagita | ............... | H04N 25/585 |
| 2018/0152650 A1* | 5/2018 | Sakakibara | ............ | H04N 25/76 |
| 2018/0184025 A1* | 6/2018 | Yanagita | ............... | H04N 25/70 |
| 2018/0191973 A1* | 7/2018 | Hirota | .................... | H04N 25/76 |
| 2018/0241955 A1* | 8/2018 | Sakano | ................. | H04N 25/585 |
| 2018/0308883 A1* | 10/2018 | Yanagita | ............... | H10F 39/8053 |
| 2018/0366513 A1* | 12/2018 | Yang | .................... | H10F 39/156 |
| 2019/0019820 A1* | 1/2019 | Takizawa | ............... | H10F 39/802 |
| 2019/0043900 A1* | 2/2019 | Oka | .................... | H04N 25/585 |
| 2019/0096933 A1* | 3/2019 | Kido | .................... | H10F 39/8027 |
| 2019/0098232 A1* | 3/2019 | Mori | .................... | H04N 25/772 |
| 2019/0222811 A1* | 7/2019 | Yamaguchi | ............ | H04N 23/88 |
| 2019/0341411 A1* | 11/2019 | Lim | .................... | H04N 25/77 |
| 2020/0154066 A1* | 5/2020 | Johnson | ............... | H04N 25/622 |
| 2020/0404204 A1* | 12/2020 | Kawazu | ............... | H04N 25/134 |
| 2021/0373205 A1* | 12/2021 | Hornstein | ............ | G02B 30/27 |
| 2021/0375970 A1* | 12/2021 | Lin | .................... | H10F 39/807 |
| 2022/0028910 A1 | 1/2022 | Lee et al. | | |
| 2022/0345651 A1* | 10/2022 | Tachi | .................... | H04N 25/704 |
| 2023/0352507 A1* | 11/2023 | Lin | .................... | H10F 39/807 |
| 2024/0105750 A1* | 3/2024 | Yang | .................... | H10F 39/199 |
| 2025/0063833 A1* | 2/2025 | Yang | .................... | H10F 39/014 |
| 2025/0126917 A1* | 4/2025 | Park | .................... | H10F 39/8063 |
| 2025/0142998 A1* | 5/2025 | Kim | .................... | H10F 39/011 |
| 2025/0169212 A1* | 5/2025 | Toda | .................... | H10F 39/805 |
| 2025/0169213 A1* | 5/2025 | Cho | .................... | H10F 39/182 |

* cited by examiner

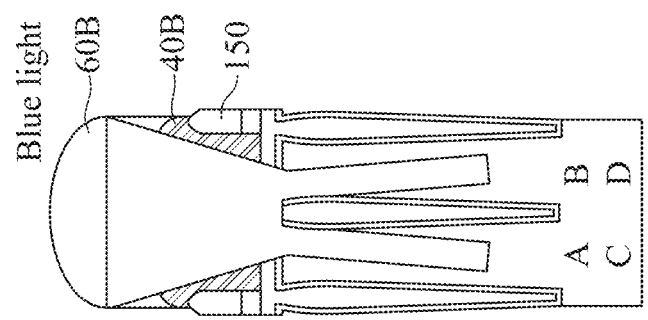
Fig. 3D
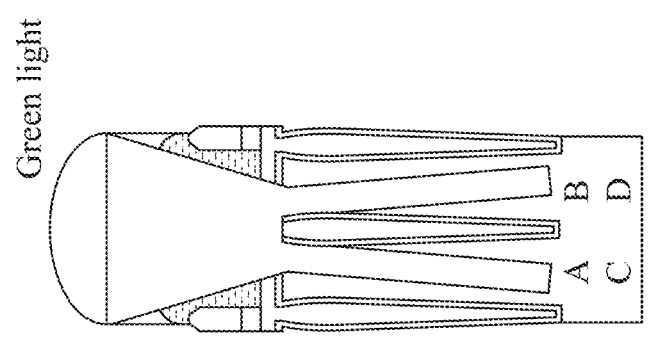
Fig. 3C
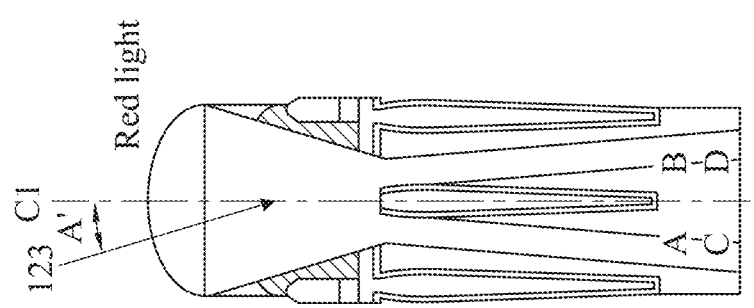
Fig. 3B
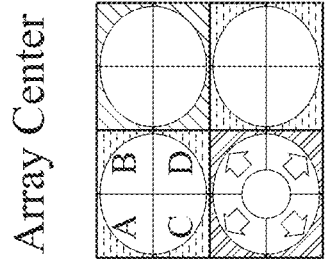

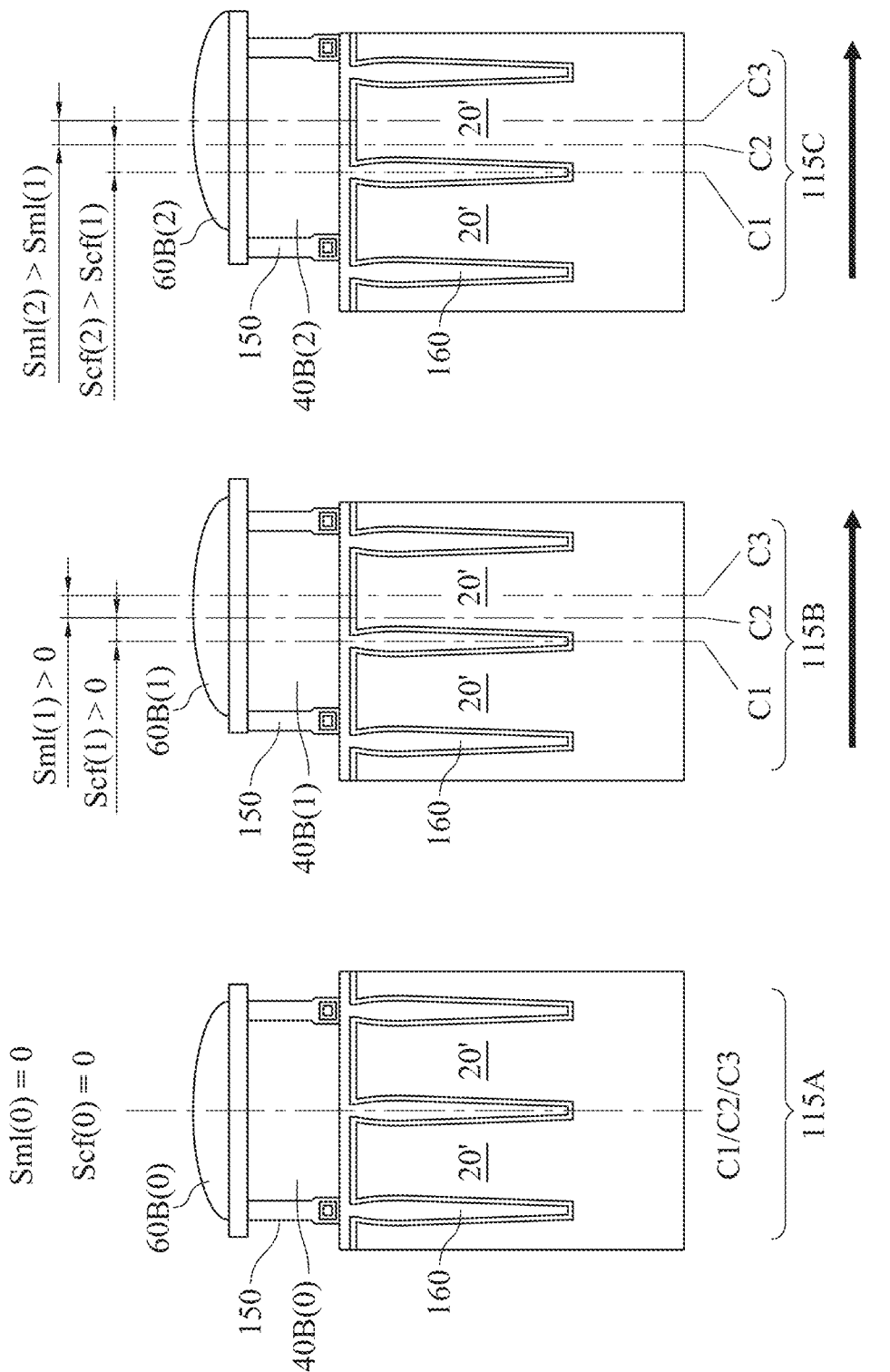

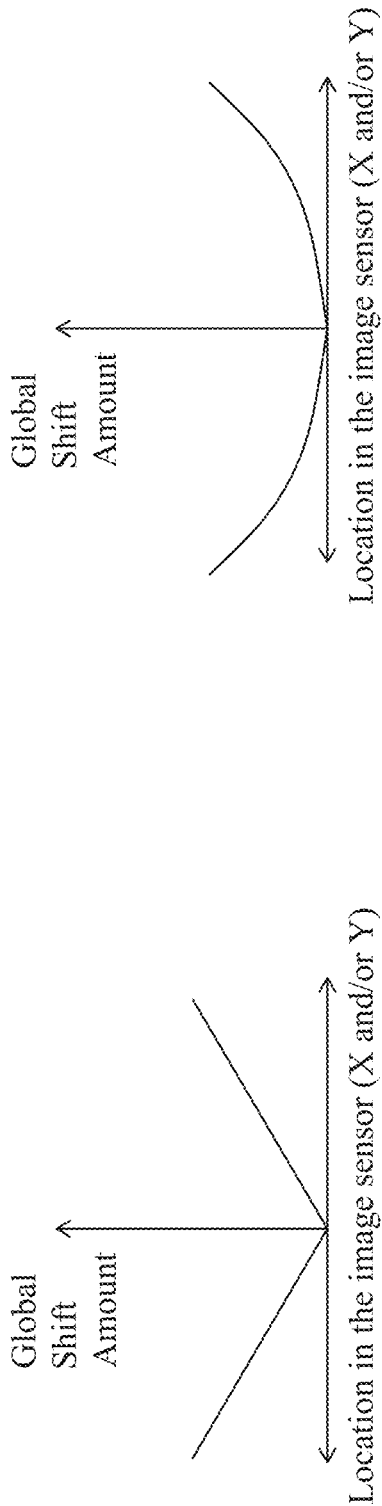
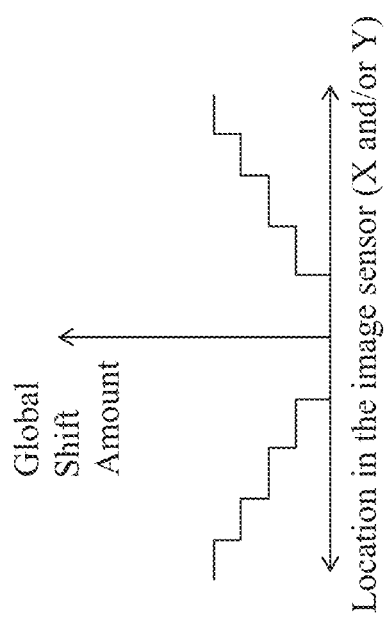
Fig. 4D
Fig. 4E
Fig. 4F

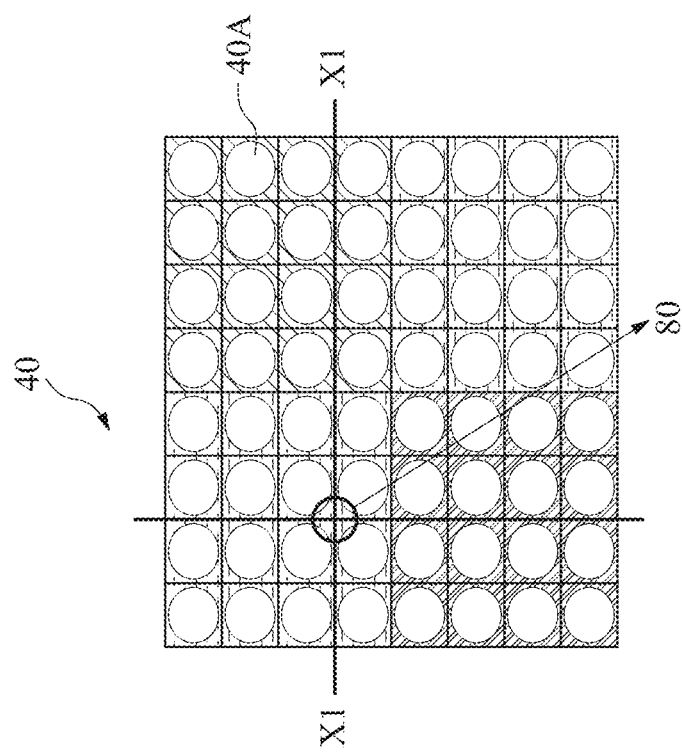
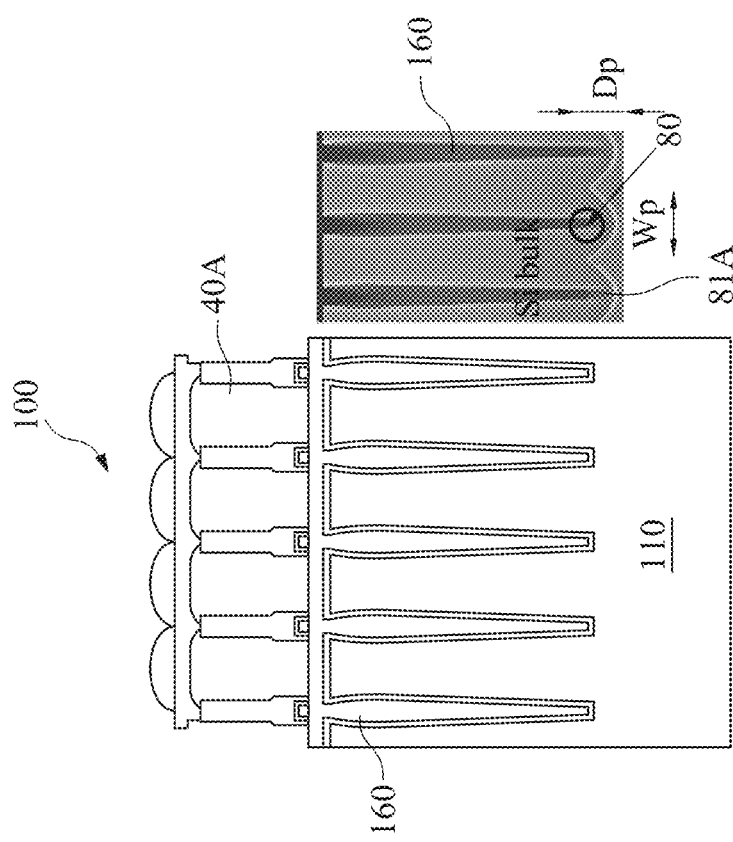
Fig. 8B
Fig. 8A

CMOS IMAGE SENSOR

PRIORITY CLAIM AND CROSS-REFERENCE

This application claims the benefit of U.S. Provisional Patent Application No. 63/409,535, filed Sep. 23, 2022, the entire content of which is incorporated herein by reference.

BACKGROUND

As the semiconductor industry has progressed into nanometer technology process nodes in pursuit of higher device density, greater performance, and lower costs, challenges for both design and fabrication of integrated circuits have greatly increased. Nowadays, CMOS image sensors are widely used. However, due to continually reduced pixel sizes in pursuit of increased resolution, CMOS image sensors may face challenges or risks such as inadequate quantum efficiency (QE) and non-uniformed pixel performance. Techniques for improving performances of the CMOS image sensors are therefore desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3B, 3C and 3D illustrate cross sectional views of PDAF pixels not making "global shifts" to the PDAF color filters and the PDAF micro-lenses in a center region of a CMOS image sensor in accordance with an embodiment.

FIG. 4A illustrates a cross sectional view showing zero "global shift" made by PDAF pixels in a center region of a CMOS image sensor in accordance with an embodiment.

FIGS. 4B and 4C illustrate cross sectional views showing "global shifts" with a trend made by PDAF pixels in an edge region of a CMOS image sensor in accordance with an embodiment.

FIGS. 4D, 4E and 4F illustrate coordinate graphs showing different ways in which the global shift amounts vary in accordance with an embodiment.

FIGS. 8A and 8B illustrate a second isolation grid structure with a conventional bowling pin shaped profile.

DETAILED DESCRIPTION

Figure 1A:
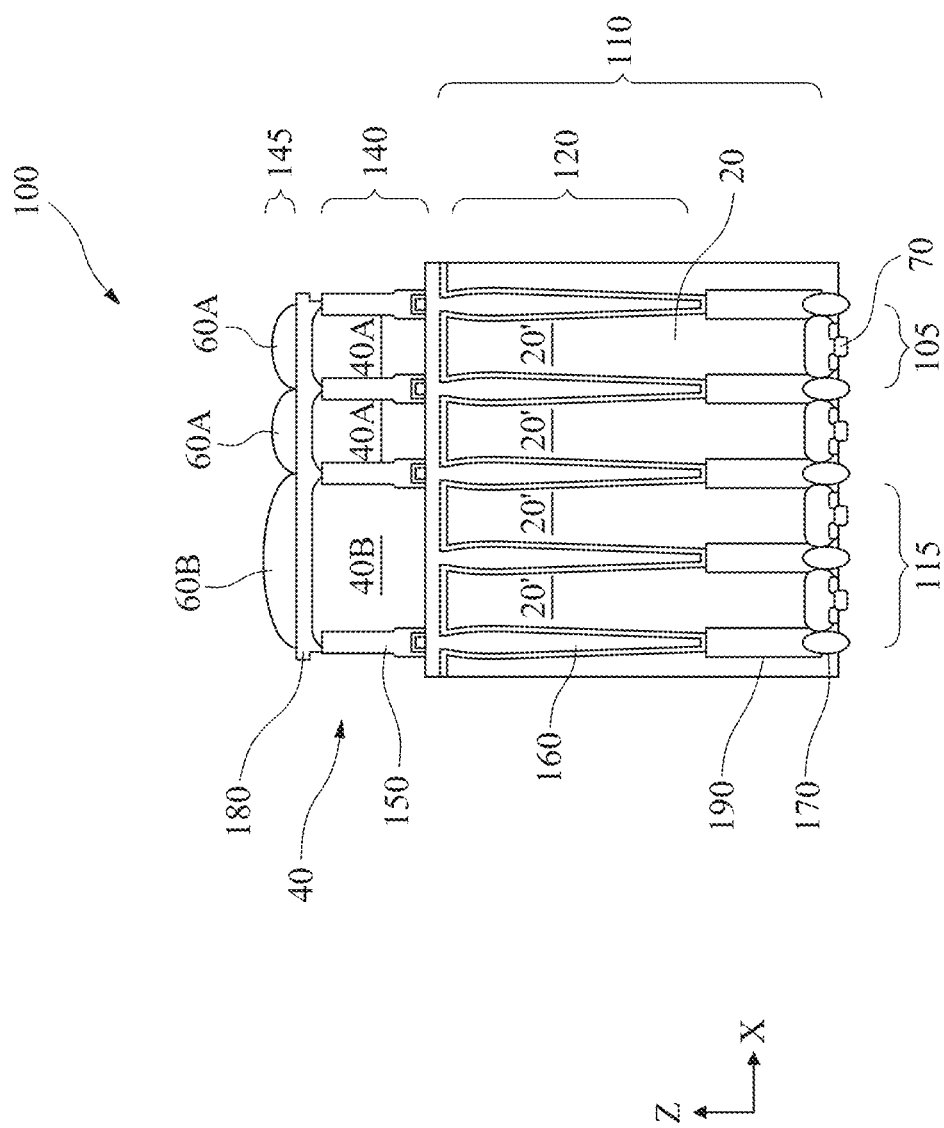
FIG. 1A illustrates a cross sectional view of a part of a CMOS image sensor in accordance with embodiments.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the following embodiments, the term "upper" "over" and/or "above" are defined along directions with an increase in a distance from the front surface and the back surface. Materials, configurations, dimensions, processes and/or operations as explained with respect to one embodiment may be employed in the other embodiments, and the detailed description thereon may be omitted.

With technical developments in integrated circuit (IC) and semiconductor industries, sizes or pitches of image pixels (or pixels) of CMOS image sensors (CIS s) are greatly reduced to increase image resolution and reduce costs. Hereinafter, "image pixels" and "pixels" are interchangeably used. However, as sizes of pixels continue to decrease to a level close to or within a visible light wavelength range, there are issues or risks of reduced quantum efficiency (QE) and poor performance uniformity among the pixels especially at edge regions of the CMOS image sensor.

The present disclosure generally relates to a CMOS image sensor including a plurality of phase detection auto-focusing (PDAF) sensors (or PDAF pixels) distributed in an array of pixels. The array of pixels includes a photodiode array in a photodiode layer, a pixel color filter array in a color filter layer and over the photodiode array, and a pixel micro-lens array in a micron-lens layer and over the color filter array. The pixel color filter array includes a plurality of pixel color filter matrixes, all having the same arrangement pattern (such as the Bayer color filter pattern) and each including, for example, 2×2 color filter units of three different colors. Each color filter unit includes a predetermined number of color filters of the same color. A PDAF sensor includes m×m binned photodiodes in the semiconductor substrate, a PDAF color filter overlying the m×m binned photodiodes, and a PDAF micro-lens overlying the PDAF color filter in some embodiments. Herein, m is an integer that is equal to or greater than 2 (such as 2, 3, 4 . . . ). The PDAF sensors can use the phase difference to quickly calculate how far the lens needs to travel to achieve focus, and thus can enhance autofocusing speed. In some embodiments, a ratio of a photodiode coverage of the PDAF color filters to a photodiode coverage of the CMOS image sensor is more than zero and up to 100%, and is in a range from about 4% to about 10% in other embodiments.

In some embodiments of the present disclosure, a first horizontal distance between a center of gravity of the PDAF color filter and a center of gravity of the m×m binned photodiodes varies depending on a location of the PDAF pixel in the CMOS image sensor due to a global shift of the PDAF color filter with respect to the underlying m×m binned photodiodes. In some embodiments, a second horizontal distance between a center of gravity of the PDAF micro-lens and the center of gravity of the PDAF color filter in horizontal plan view also varies depending on the location of the PDAF pixel in the CMOS image sensor due to a global shift of the PDAF micro-lens with respect to the underlying PDAF color filter. Due to the global shifts made by the PDAF color filters and the PDAF micro-lens, performance uniformity of the CMOS image sensor are advantageously improved.

In addition, in some embodiments of the present disclosure, the CMOS image sensor includes a composite grid insolation structure to laterally separate pixel color filters adjacent to each other and to laterally separate each PDAF color filter from adjacent pixel color filters in the color filter layer. The composite isolation structure includes a first low refractive index (low-n) dielectric grid of a first dielectric material, a second low-n dielectric grid of a second dielectric material and underlying the first low-n dielectric grid, and a metal grid at least partially enclosed by the second low-n dielectric grid in some embodiments. The second low-n dielectric grid includes a filler dielectric material different from and mixed with the second dielectric material in the second dielectric material, and a refractive index of the filler dielectric material is different from a refractive index of the second dielectric material to enhance reflections and primarily scatterings of incident light, in some embodiments. Thus, total internal reflection of incident light in pixel channels of the CMOS image sensor is increased, and quantum efficiency (QE) of the CMOS image sensor is advantageously improved.

Figure 1B:
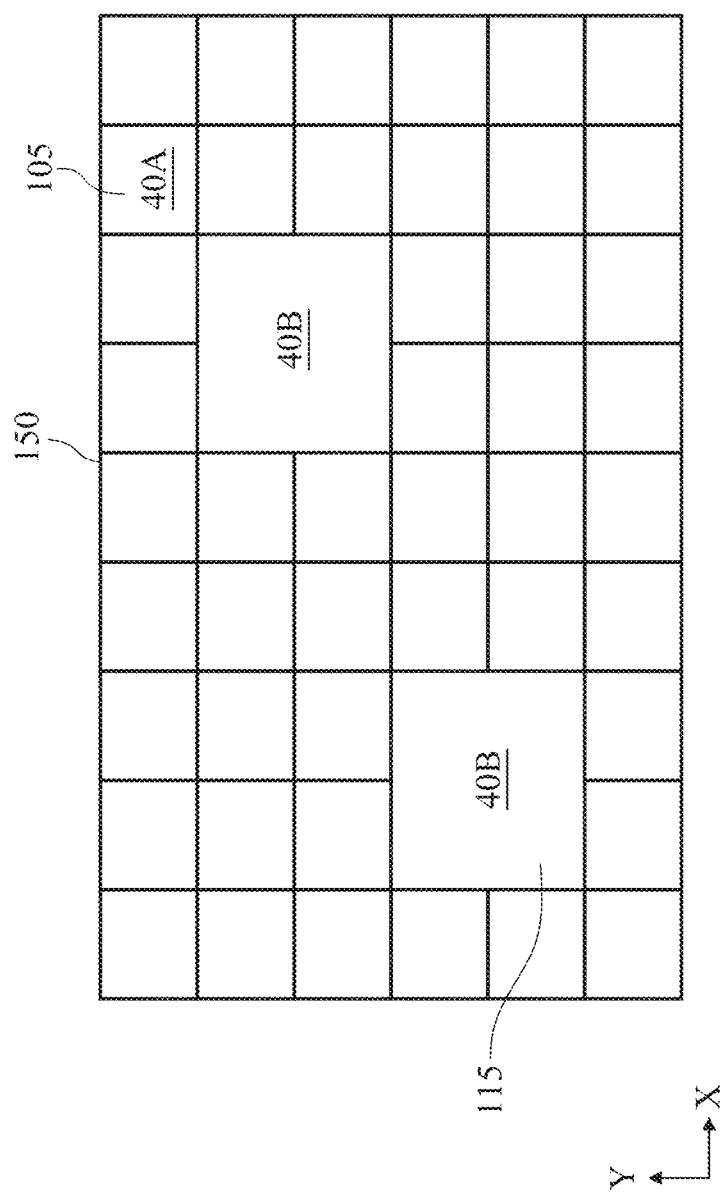
FIG. 1B illustrates a part of layout of pixel image sensors and phase detection auto-focusing (PDAF) sensors (or PDAF pixels) in accordance with an embodiment.

FIG. 1A illustrates a cross sectional view of a part of a CMOS image sensor 100 in accordance with embodiments. The CMOS image sensor 100 includes an array of image pixels 105 and one or more PDAF pixels 115 that are distributed in the array of image pixels 105 in plan view. FIG. 1B shows a part of a top plan view (or layout) of image pixels 105 and PDAF pixels 115 in accordance with an embodiment. The layout can be defined by a first isolation structure 150.

In some embodiments, the CMOS image sensor 100 includes a photodiode layer 120 formed in a semiconductor substrate 110, a color filter layer 140 over the photodiode layer 120, and a micro-lens layer 145 over the color filter layer 140. The photodiode layer 120 includes an array 20 of photodiodes 20' disposed in a semiconductor substrate 110. The substrate 110 may include a single crystalline semiconductor material such as, but not limited to silicon.

The color filter layer 140 includes an array 40 of color filters (or pixel color filters) 40A and a plurality of PDAF color filters 40B. Hereinafter, "pixel color filter" and "color filter" are interchangeably used. Each pixel color filter 40A is disposed over a single corresponding photodiode 20', and each PDAF color filter 40B is disposed over a cluster of m×m binned photodiodes 20'.

The micro-lens layer 145 includes an array of pixel micro-lenses 60A overlying and aligning with the array of pixel color filters 40A, and a plurality of PDAF micro-lenses 60B overlying and aligning with the plurality of PDAF color filters 40B.

The CMOS image sensor 100 includes a first isolation structure 150 (more details shown in FIGS. 6A-6E) disposed in the color filter layer 140 to laterally separate adjacent color filters 40A and to laterally separate a PDAF color filter 40B from adjacent color filters 40A.

The CMOS image sensor 100 also includes a second isolation structure 160 disposed in the semiconductor substrate 110 to laterally separate adjacent photodiodes 20' of the photodiode array 20 in the photodiode layer 120. In some embodiments, the second isolation structure 160 includes a deep trench isolation (DTI) grid that vertically extends into the substrate 110 from an upper surface of the photodiode layer 120. In some embodiments, the DTI grid 160 substantially aligns with the first isolation structure 150.

In some embodiments, the CMOS image sensor 100 includes an array of the transfer transistors 70 disposed in the semiconductor substrate 110. The CMOS image sensor 100 includes a shallow trench isolation (STI) grid 170 that is aligned with the DTI grid 160 and laterally separates adjacent transfer transistors 70. Each transfer transistor 70 includes a gate structure, source/drain regions, and a gate dielectric. Source and drain are used interchangeably in this disclosure.

In some embodiments, the CMOS image sensor 100 also includes an ion implantation grid 190 that is disposed between the DTI grid 160 and the STI grid 170 in the semiconductor substrate 110 to laterally separate adjacent photodiodes 20' of the photodiode array 20.

In some embodiments, the CMOS image sensor 100 includes a separation layer 180 (or "underlayer") that separates the micro-lens layer 145 and the color filter layer 140.

In FIG. 1B, as aforementioned, boundaries of pixel color filters 40A of image pixels 105 and PDAF color filters 40B of PDAF pixels 115 are defined by the first isolation structure 150 in the color filter layer 140. The shapes of grid segments of the first isolation structure 150 are square in some embodiments, and are rectangular in other embodiments. Accordingly, grid segments of the first isolation structure 150 as "walls" define spaces for pixel color filters 40A and for PDAF color filters 40B in the color filter layer 140.

In some embodiments, the grid structure 150 includes the metal grid structure that defines spaces and locations of the pixel color filters 40A and the PDAF color filters 40B in the color filter layer 140 as shown in FIG. 1A.

Referring to FIGS. 1A and 1B, as aforementioned, the CMOS image sensor 100 includes an array of image pixels 105 and one or more PDAF pixels 115 distributed in the array of image pixels 105. Each image pixel 105 includes a photodiode 20' surrounded by a segment of a second isolation structure (such as a DTI) 160, a color filter 40A of a color (such as red, blue, or green) disposed over the photodiode 20', and a micro-lens 60A disposed over the color filter 40A, thus forming a light channel.

An incident light on a top surface of the image pixel 105 is focused by the micro-lens 60A onto an effective area of the color filter 40A, filtered by the color filter 40A to become a monochromic light beam, and received by the photodiode 20'. The photodiode 20' transforms the intensity of the received incident light into electric signals. A transfer transistor 70 corresponding to photodiode 20' in the pixel 105 facilities read-out of the electric signals. The one or more PDAF pixels 115 distributed in the array of pixels 105 facilitate quick autofocusing on expected targets by the CMOS image sensor 100.

Figure 2A:
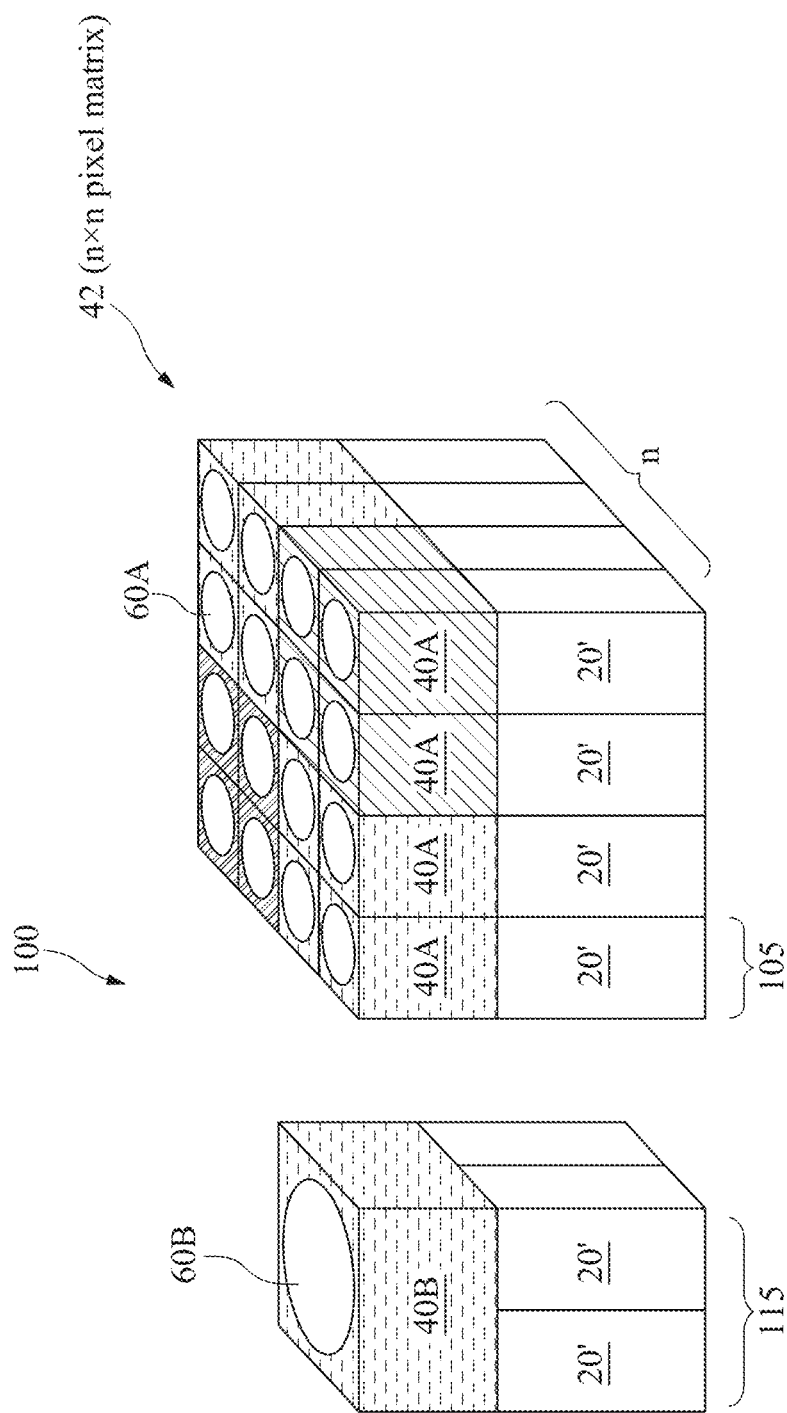
FIG. 2A illustrates a schematic view of a matrix of image pixels and a PDAF pixel in accordance with an embodiment.
Figure 2B:
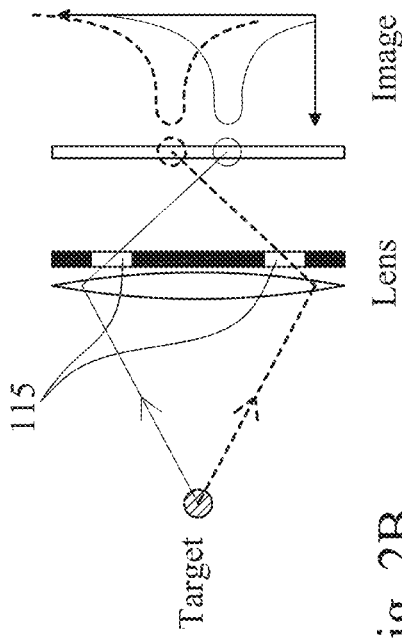
FIGS. 2B, 2C, 2D and 2E illustrate the function of a PDAF pixel of a CMOS image sensor in accordance with an embodiment.
Figure 2C:
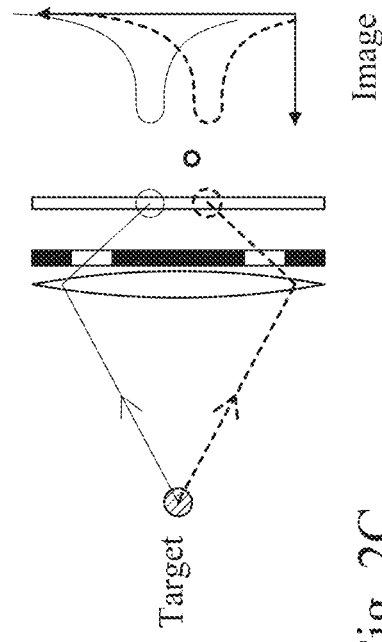
Figure 2D:
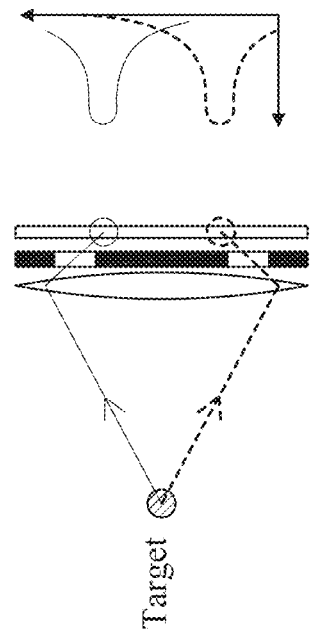
Figure 2E:
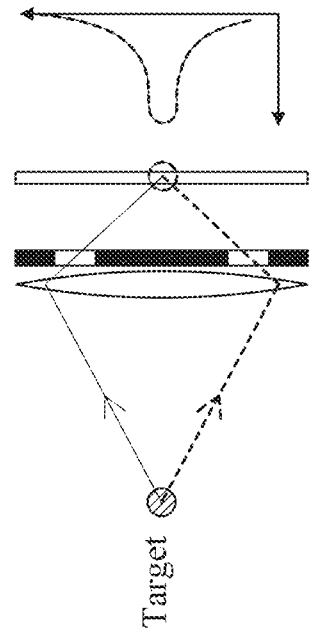

FIG. 2A illustrates a schematic view of a PDAF pixel 115 and a n×n (e.g., n=4) matrix 42 of pixels 105 in accordance with an embodiment. A CMOS image sensor 100 includes an array of image pixels 105 and a plurality of PDAF pixels 115. The PDAF pixel 115 includes m×m binned photodiodes 20' in a photodiode layer, a PDAF color filter 40B overlying the m×m binned photodiodes 20' in the color filter layer, and a PDAF micro-lens 60B overlying the PDAF color filter 40B.

FIGS. 2B, 2C, 2D and 2E illustrate the function of a PDAF pixel of a CMOS image sensor. As shown in FIGS. 2B-2E, two dedicated PDAF pixels (or sensors) 115 are used in a CMOS image sensor to capture separate images from a target or subject for comparison, for example. When a distance between the target and the CMOS image sensor is very far, too far, very near, or too near, two blurry images are captured by the two PDAF pixels. The phase difference between the two blurry images can be calculated to determine the focus point, and in this way PDAF pixels 115 facilitate autofocusing on the target by the CMOS image sensor.

Figure 2F:
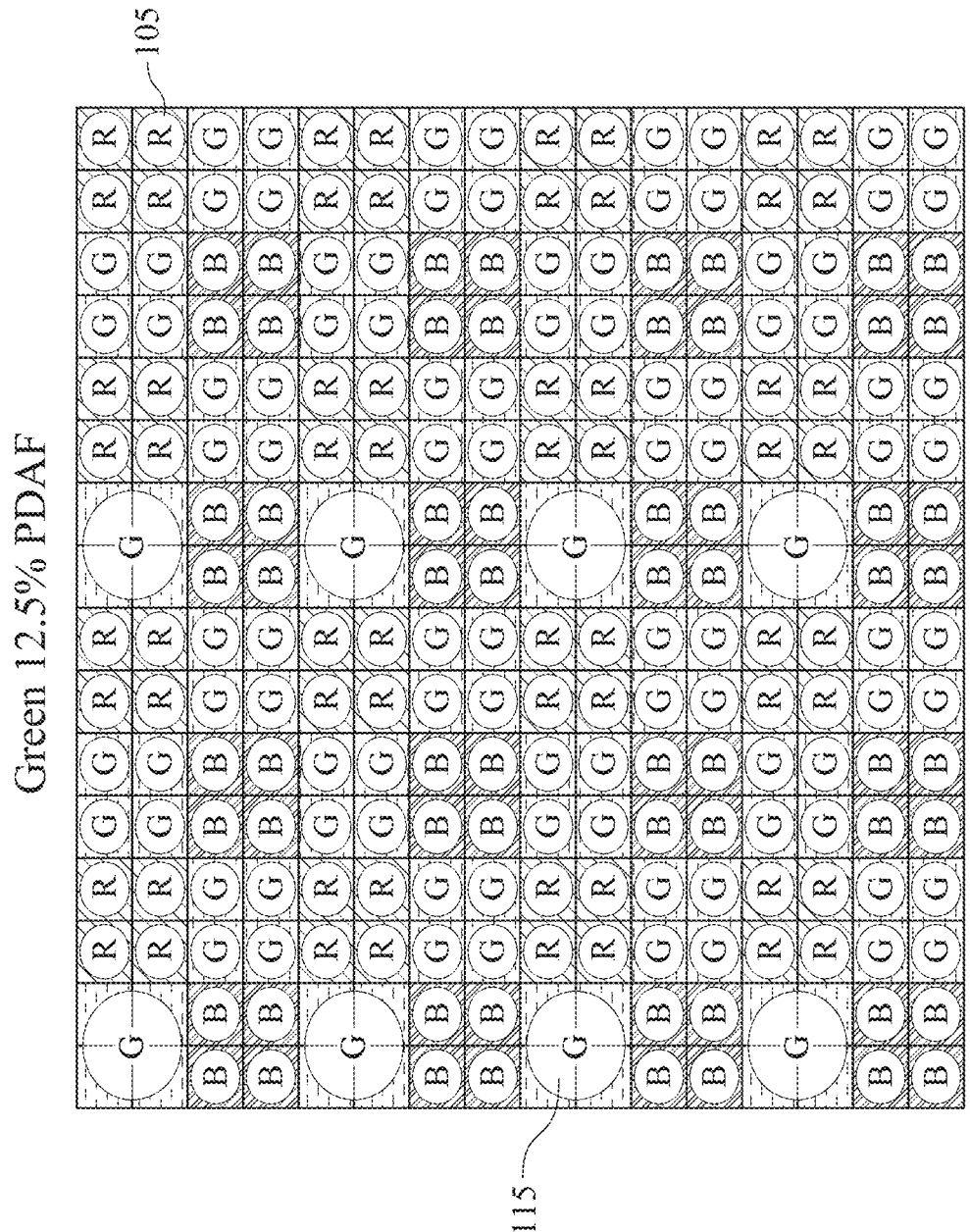
FIGS. 2F, 2G and 2H illustrate various PDAF sensor distributions in an array of image pixels in accordance with an embodiment.
Figure 2G:
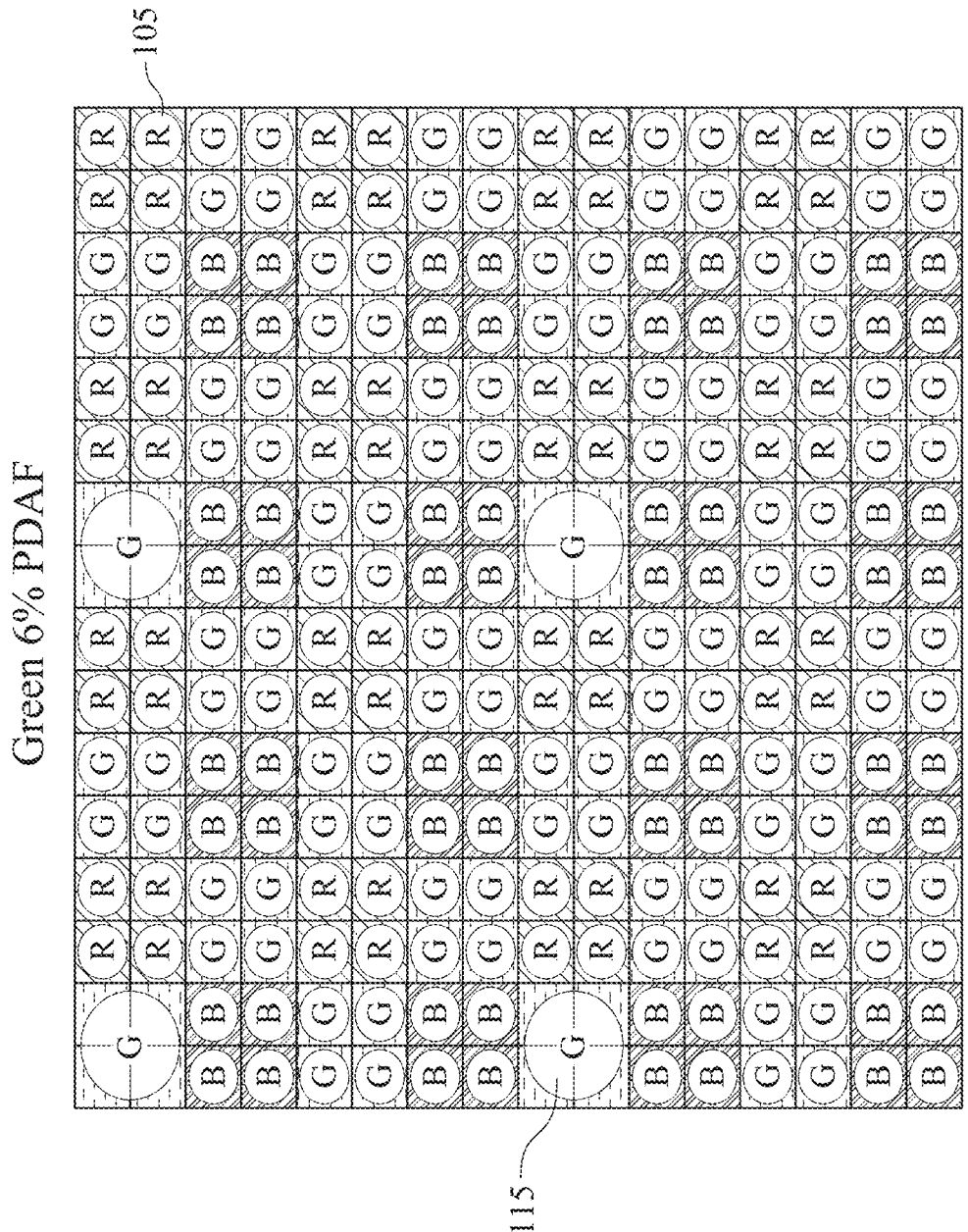
Figure 2H:
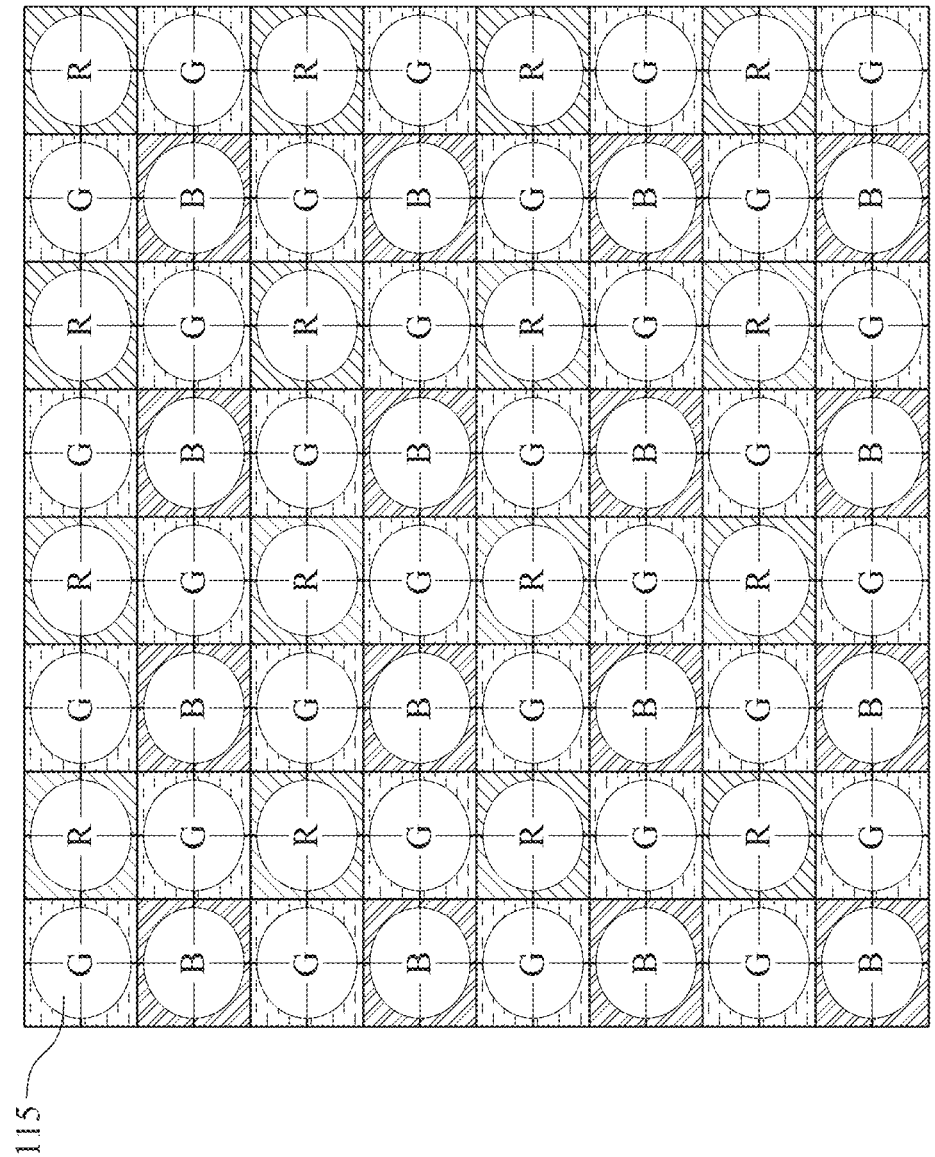

FIGS. 2F, 2G and 2H illustrate PDAF pixels 115 distributed in an array of image pixels 105 in accordance with an embodiment. In some embodiments, the PDAF pixels 115 are green colored. In other embodiments, the PDAF pixels 115 are red or blue colored. The ratio (e.g., 12.5%) is defined as the number (e.g., 8) of PDAFs of a color (e.g., green) divided by the number (e.g., 64) of units of m×m pixels in an array. A PDAF 115 corresponds to a unit of m×m pixels 105. Herein, m is an integer equal to or greater than 2 (such as 2, 3, 4 . . . ). FIG. 2F illustrates 8 green PDAF pixels 115 distributed in the array of image pixels 105 and having about 12.5% ratio (8/64) of a photodiode coverage of the PDAF color filters 40B to a photodiode coverage of the CMOS image sensor 100. FIG. 2G illustrates 4 green PDAF pixels 115 distributed in the array of image pixels 105 and having about 6.25% ratio (4/64) of a photodiode coverage of the PDAF color filters 40B to a photodiode coverage of the CMOS image sensor 100. A PDAF color filter size and a PDAF micro-lens size of a PDAF 115 are much larger than a pixel color filter size and a micro-lens size of a pixel 105. Having more PDAFs 115 in a CMOS image sensor 100 can increase dynamic range.

FIG. 2H illustrates PDAF pixels 115 having 100% ratio of a photodiode coverage of the PDAF color filters 40B to a photodiode coverage of the CMOS image sensor 100 and being arranged in the Bayer pattern or layout. As shown in FIG. 2H, the PDAFs can be in a combination of red, blue, and green, and can be arranged in the Bayer pattern. In this way, the CMOS image sensor 100 in FIG. 2H only includes PDAF pixels without any image pixels 105, and thus dynamic range of the CMOS image sensor 100 is increased and resolution of the CMOS image sensor 100 may be lowered.

As sizes of image pixels 105 continue to decrease to be close to or within a visible light wavelength range in pursuit of high resolution, there is an issue or risk of non-uniform performance of the CMOS image sensor 100. In the present disclosure, a novel integrated structure and design for PDAF pixels 115 are disclosed.

Figure 3A:
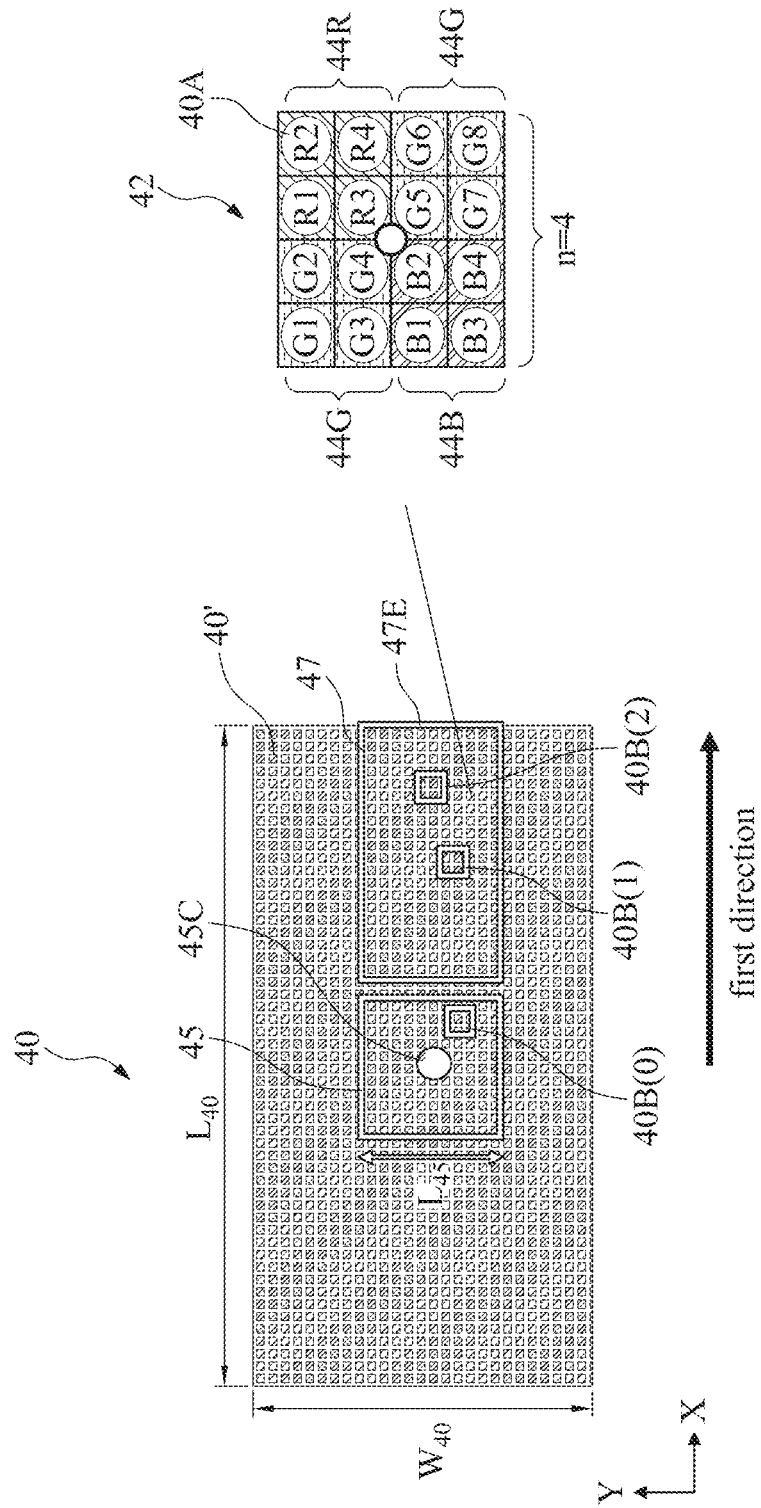
FIG. 3A illustrates a top plan view of an array of pixel color filters and a plurality of PDAF color filters of a CMOS image sensor in accordance with an embodiment.

FIG. 3A illustrates a top plan view of an array 40 of color filters 40A and a plurality of PDAF color filters 40B of a CMOS image sensor 100 in accordance with an embodiment. The color filter array 40 of the CMOS image sensor 100 includes a center region 45, and edge regions (such as the right edge region 47) beyond the center region 45. For example, the color filter array 40 can be rectangular-shaped with a length $L_{40}$ and a width $W_{40}$ ($L_{40}>W_{40}$) and centered at a center point 45C, and the center region 45 can be square-shaped with an edge length $L_{45}$ and also centered at the center point 45C. The color filter array 40 can also be square-shaped and thus $L_{40}=W_{40}$), for example. In some embodiments, a ratio of the edge length $L_{45}$ of the center region 45C and the width $W_{40}$ of the color filter array 40 for the Y direction is defined to be in a range from about 0.3 to about 0.8. In some embodiments, a ratio of the edge length $L_{45}$ of the center region 45C and the length $L_{40}$ of the color filter array 40 for the X direction is defined to be in a range from about 0.15 to about 0.3. Any regions, such as the right region 47, beyond the center region 45 are defined as edge regions. The plurality of PDAF color filters 40B of the PDAF pixels 115 are distributed in the color filter array 40 of the image pixels 105.

In some embodiments, the color filters 40A are horizontally (X) and vertically (Y) arranged into a plurality of color filter matrixes 42. Each color filter matrix 42 has the same horizontal and/or vertical arrangement pattern in plan view. In some embodiments, each color filter matrix 42 includes an n×n square color filter matrix defined by the first isolation structure 150, where n=an even integer. For example, when n=4, each color filter matrix 42 includes 2×2 color filter units 44 (such as 44G, 44R, 44B, and 44G as shown in FIG. 3A), and each color filter unit 44 includes 4 (2×2) (i.e., 4/2×4/2) pixel color filters 40A of the same color selected from red, blue, and green. For example, a red color filter unit 44R includes 4 red pixel filters 40A. There is an n×n square photodiode matrix under the color filter matrix 42.

In some embodiments, the color filter matrix 42 is defined by the first isolation structure 150 (as shown in FIGS. 1A and 1B), of which boundary is shared by adjacent pixel color filters 40A. The PDAF color filter 40B is also defined by the first isolation structure 150, of which boundary is shared by adjacent pixel color filters 40A.

Figure 3G:
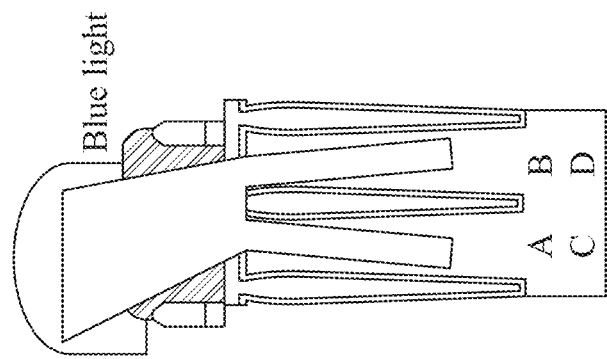
FIGS. 3E, 3F and 3G illustrate cross sectional views of PDAF pixels making "global shifts" to the PDAF color filters and the PDAF micro-lenses in an edge region of a CMOS image sensor in accordance with an embodiment.
Figure 3F:
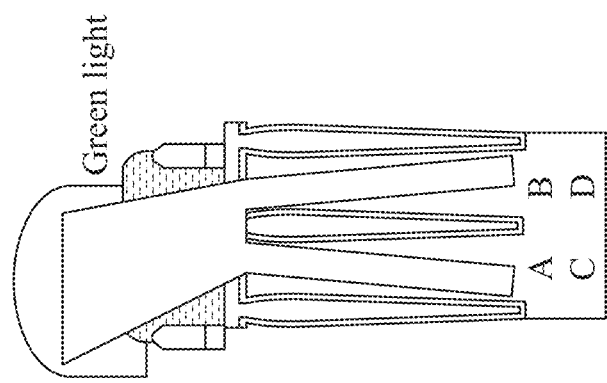
Figure 3E:
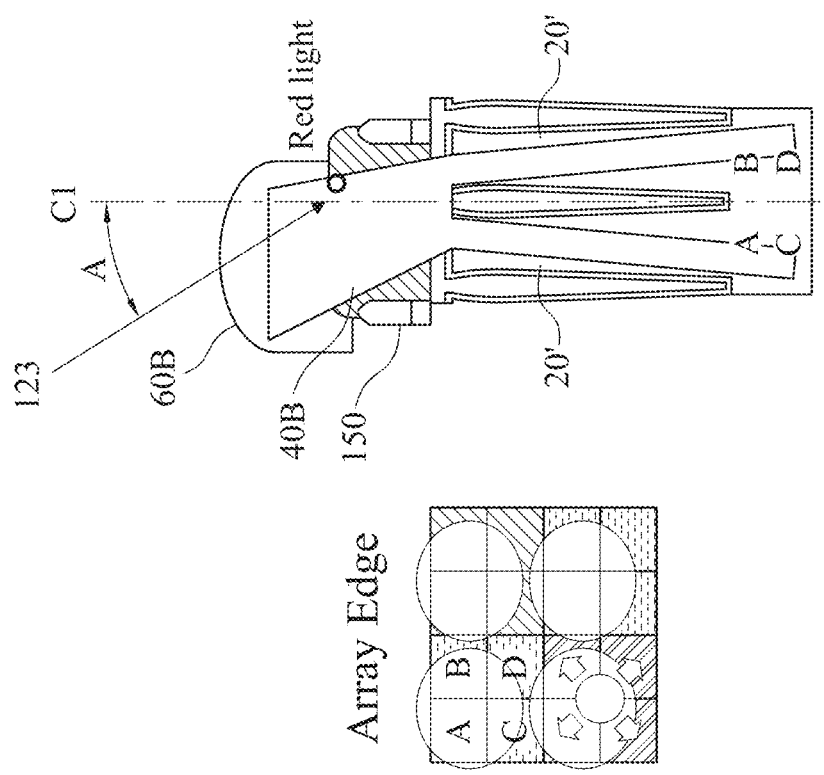

In some embodiments, a PDAF color filter 40B (as shown in FIGS. 3E, 3F and 3G) makes a "global shift," that is a horizontal offset as a whole in a particular horizontal direction relative to the m×m binned photodiodes 20' underlying the PDAF color filter 40B (m is an integer equal to or greater than 2, like 2, 3, 4 . . . ). In some embodiments, a PDAF color filter 40B is in red, blue, or green. In some embodiments, a PDAF micro-lens 60B (as shown in FIGS. 3E, 3F and 3G) makes a "global shift," that is a horizontal offset as a whole in a particular horizontal direction relative to the PDAF color filter 40B underlying the PDAF micro-lens 60B.

FIGS. 3B, 3C and 3D illustrate cross sectional views of PDAF pixels 115 having PDAF color filters 40B and PDAF micro-lenses 60B without "global shifts" in a center region 45 of a CMOS image sensor 100 in accordance with an embodiment. In some embodiments, a PDAF color filter 40B is in red, blue, or green. In some embodiments, the PDAF color filter 40B and the PDAF micro-lens 60B do not make any global shifts in a center region 45 of the CMOS image sensor 100. In some embodiments, the color filters 40B of the plurality of PDAF pixels 115 distributed in the array of pixels 105 of the CMOS image sensor 100 are the same color, which is selected from green, red, or blue.

FIGS. 3E, 3F and 3G illustrate cross sectional views of PDAF color filters and PDAF micro-lenses making "global shifts" in an edge region 47 (as shown in FIG. 3A) of a CMOS image sensor 100 in accordance with an embodiment. In some embodiments, the PDAF color filter 40B and/or the PDAF micro-lens 60B make global shifts in any of the edge regions 47 of the color filter array 40.

As shown in FIGS. 3E, 3F and 3G, an angle A formed between the incident light 123 and a vertical center line C1 of a PDAF pixel 115 in an edge region 47 is larger than an angle A' (close to zero as shown in FIGS. 3B, 3C and 3D) formed between the incident light 123 and a vertical center line C1 of a PDAF pixel 115 in the center region 45. The amount of incident light 123 reaching the binned photodiodes 20' of the PDAF pixels 115 in the edge region 47 is thus less than that in the center region 45. In edge regions, the amount of incident light 123 reaching the binned photodiodes 20' of the PDAF pixels 115 varies depending on locations of the PDAF pixels 115 in the edge regions 47. The farther away the PDAF pixels 115 are from a center of the center region 45, the amount of incident light 123 reaching the binned photodiodes 20' of the PDAF pixels 115 is less. "Global shifts" made to PDAF color filters 40B and PDAF micro-lenses 60B of PDAF pixels 115 can increase the amount of incident light 123 reaching the binned photodiodes 20' of the PDAF pixels 115 in edge regions 47, and thus advantageously improve optical performance and uniformity of the CMOS image sensor 100.

FIG. 4A illustrates a cross sectional view showing that PDAF pixels 115A do not make "global shifts" in a center region 45 of a CMOS image sensor 100 in accordance with an embodiment. FIGS. 4B and 4C illustrate cross sectional views respectively showing that the PDAF pixels 115B and 115C make various "global shifts" (such as PDAF color-filter global shifts, and PDAF micro-filter global shifts as shown in FIGS. 3E, 3F and 3G) in an edge region 47 of a CMOS image sensor 100 as shown in FIG. 3A in accordance with an embodiment. The PDAF pixel 115C is relatively further away from the center point 45C than the PDAF pixel 115B.

In some embodiments, in an edge region 47 (e.g., a right region) beyond the center region 45 of the CMOS image sensor 100 as shown in FIG. 3A, the PDAF color filters 40B and/or PDAF micro-lenses 60B make global shifts by global shift amounts that vary in the same trend (e.g., increasing along a certain direction) depending on the locations of the PDAF pixels 115 in the CMOS image sensor.

In some embodiments, in an edge region 47 (e.g., a right region) beyond the center region 45 of the CMOS image sensor 100 as shown in FIG. 3A, PDAF color filters 40B and/or PDAF micro-lenses 60B make global shifts by gradually increasing shift amounts in a first horizontal direction from a center 45C of the center region 45 to an edge 47E of the edge region 47.

In FIGS. 4A-4C, a vertical center line C1 represents a center (or a center of gravity) of a m×m (m=2) binned the photodiodes 20' of a PDAF pixel 115. A vertical center line C2 represents a center (or a center of gravity) of a PDAF color filter 40B overlying the corresponding m×m binned the photodiodes 20'. A vertical center line C3 represents a center (or a center of gravity) of a PDAF micro-lens 60B overlying the corresponding color filter 40B.

Referring to FIG. 4A and FIG. 3, in a center region 45 of the CMOS image sensor 100, zero or no global shift is made to a PDAF color filter 40B(0) relative to corresponding m×m (m=2) binned photodiodes 20' underlying the PDAF color filter 40B(0) in some embodiments. A distance (Scf) between the vertical center lines C2 and C1 is zero, Scf(0)=0.

In some embodiments, zero or no global shift is made to a PDAF micro-lens 60B(0) relative to the corresponding PDAF color filter 40B(0). A distance (Sml) between the vertical center lines C3 and C2 is zero, Sml(0)=0.

Referring to FIG. 4B and FIG. 3, in an edge region 47 (such as a right edge region) of the CMOS image sensor 100, a PDAF color filter 40B(1) of a PDAF pixel 115 located in the right edge region 47 makes a first color-filter global shift with a first color-filter global shift amount Scf(1) to the right (e.g., +X) with respect to the corresponding m×m (m=2) binned the photodiodes 20' underlying the PDAF color filter 40B(1) in some embodiments. A first distance Scf(1) between the center lines C2 and C1 is greater than zero, Scf(1)>0.

In some embodiments, a PDAF micro-lens 60B(1) overlying the corresponding PDAF color filter 40B(1) of the PDAF pixel 115 makes a first micro-lens global shift with a first micro-lens global shift amount Sml(1) to the right (e.g., +X) with respect to the corresponding PDAF color filter 40B(1). A first distance Sml(1) between the center lines C3 and C2 is greater than zero, Sml(1)>0.

Referring to FIG. 4C and FIG. 3, in the edge region 47 (such as the right edge region) of the CMOS image sensor 100, a PDAF color filter 40B(2) of a PDAF pixel 115 located in the edge region 47 and further away from the center region 45 makes a second color-filter global shift with a second color-filter global shift amount Scf(2) to the right (e.g., +X) with respect to the corresponding underlying m×m (m=2) binned photodiodes 20' underlying the PDAF color filter 40B(2) in some embodiments. A second distance Scf(2) between the center lines C2 and C1 is greater than Scf(1), Scf(2)>Scf(1).

In some embodiments, a PDAF micro-lens 60B(2) overlying the corresponding PDAF color filter 40B(2) of the PDAF pixel 115 makes a second micro-lens global shift with a second micro-lens global shift amount Sml(2) to the right (e.g., +X) with respect to the corresponding PDAF color filter 40B(2). A second distance Scf(2) between the center lines C3 and C2 is greater than Scf(1), Scf(2)>Scf(1).

Global shifts for color filters and micro-lenses of PDAF pixels 115 in the right edge region 47 can be made as aforementioned. However, the edge 47E of the edge region 47 can be any edge (such as right, left, up, or down edges) in the CMOS image sensor 100. In the same way or similarly, in some embodiments, in the left region (−X), the upper region (+Y), or the lower region (−Y) of the CMOS image sensor 100, global shifts of PDAF color filters and PDAF micro-lenses are applied by increasing global shift amounts depending on distances of the PDAF pixels 115 from a center of the COMS image sensor 100. The global shift amounts (such as the color-filter global shift amounts and the micro-lens global shift amounts) in the Y direction is the same as or similar to the global shift amounts in the X direction in some embodiments.

FIGS. 4D, 4E and 4F are coordinate graphs illustrating different ways in which the global shift amounts S, such as the color-filter global shift amounts (Scf) and the micro-lens global shift amounts (Sml), vary in accordance with an embodiment. In some embodiments, as shown in FIG. 4D, the shift amount S linearly increases in a direction from the center 45C to an edge 47E of the edges as shown in FIG. 3A. In some embodiments, as shown in FIG. 4E, the shift amount S non-linearly increases (such as gradually and slowly increasing) from the center 45C to the edge 47E of the edges as shown in FIG. 3A. In some embodiments, as shown in FIG. 4F, the shift amount S increases in a step-wise manner from the center 45C to the edge 47E of the edges as shown in FIG. 3A. Any combination of the shift amounts illustrated in FIGS. 4D, 4E and 4F is possible. The direction of the global shift is along a horizontal direction and/or a vertical direction of the image sensor in plan view. In some embodiments, the maximum shift amount at the edge of the color filter array is in a range from about 50 nm to about 300 nm.

In some embodiments, sizes of the color filters 40B and the micro-lenses 60B of the PDAF pixels 115 in plan view in the CMOS image sensor 100 vary depending on locations of the PDAF pixels 115 in the CMOS image sensor 100. In some embodiments, the sizes of the color filters 40B and the micro-lenses 60B of the PDAF pixels 115 in plan view gradually decrease in the first direction from the center 45C of the center region 45 to the edge 47E of the edge region 47.

Advantageously, the global shifts made to the PDAF color filters 40B and/or the PDAF micro-lenses 60B of the PDAF pixels 115 in edge regions 47 beyond the center portion 45 in plan view of the CMOS image sensor 100 increase incident light amount reaching the photodiodes underlying the PDAF color filters 40B of the PDAF pixels 115 in the edge regions 47, thereby compensating reduced incident light due to the narrow channel width of the PDAF and the increased incident light angle in the edge regions and thus increasing performance uniformity of the PDAF pixels in the edge regions of the CMOS image sensor 100.

Figure 5:
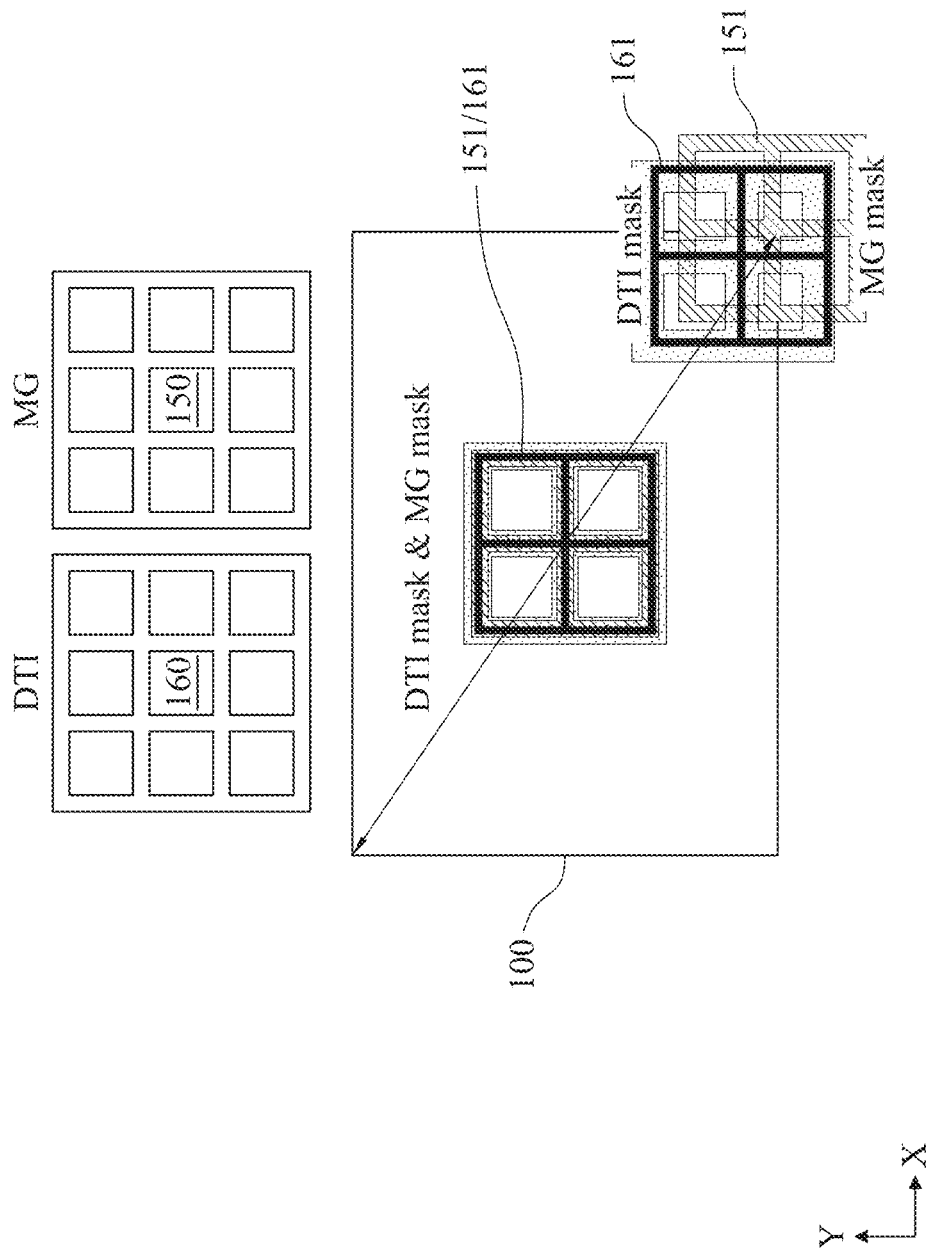
FIG. 5 illustrates a top plan view of parts of the first and the second photo masks relative to a top surface of a CMOS image sensor in accordance with an embodiment.

FIG. 5 illustrates a top plan view of a part of the first photo mask 151 for the first isolation structure 150 and a part of the second photo mask 161 for the second isolation structure 160 relative to a top surface of a CMOS image sensor 100 in accordance with an embodiment. The first isolation structure 150 may include a metal grid structure. The second isolation structure 160 may include a DTI structure. Each of the first photo mask 151 and the second photo mask 161 includes layout patterns corresponding to color filters 40A in some embodiments. As shown in FIG. 5, in a center portion of the top surface of the CMOS image sensor 100, the patterns of the first photo mask 151 for the first isolation structure 150 and the patterns of the second photo mask 161 for the second isolation structure 160 align with each other without global shifts. In an edge portion away from the center portion, the patterns of the first photo mask 151 are further offset from the patterns of the second photo mask 161. In other words, the patterns of the first photo mask 151 are shifted or offset a greater amount relative to the patterns of the second photo mask 161. In this way, global shifts of the PDAF color filters can be made.

FIGS. 6A-6D illustrate cross sectional views of the first isolation structure 150 of a CMOS image sensor in accordance with embodiments. FIG. 6E illustrates a top plan view of the first isolation structure 150 of a CMOS image sensor 100 in accordance with an embodiment.

FIGS. 6A-6D are cross sectional views corresponding to line X1-X1 of FIG. 6E. FIG. 6E shows a part corresponding to a cross point of the grid shown in FIG. 1B. In some embodiments, the first isolation structure 150 is manufactured by using one or more lithography and etching operations, using one or more photo masks.

Figure 6B:
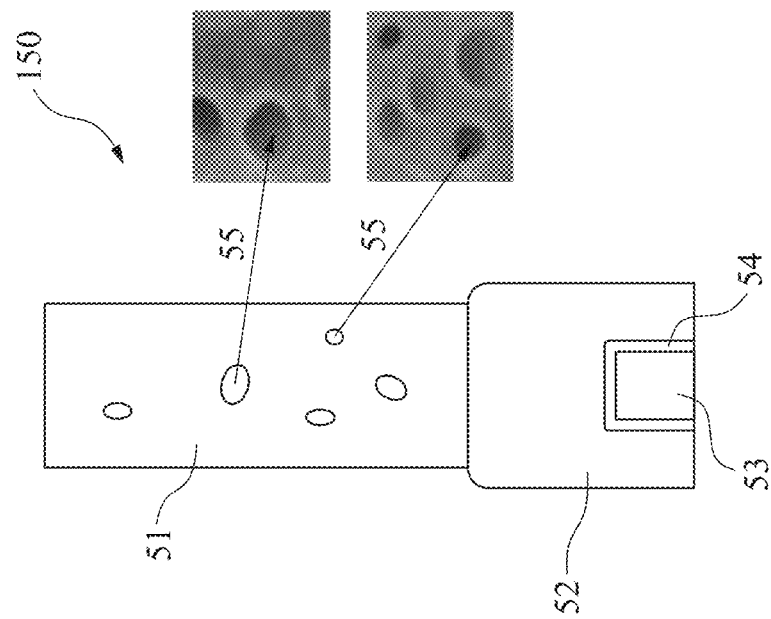
FIGS. 6A, 6B, 6C and 6D illustrate cross sectional views of a first isolation structure of a CMOS image sensor in accordance with embodiments.
Figure 6A:
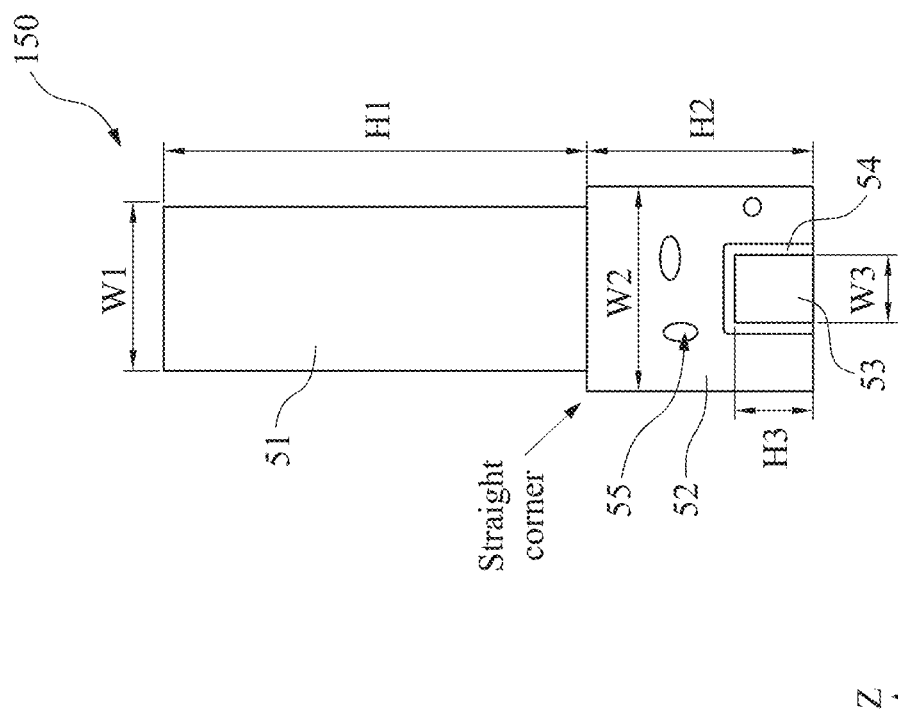

In accordance with an embodiment, as shown in FIGS. 6A and 6B, the first isolation structure 150 includes a first low refractive index (low-n) dielectric grid 51, a second low-n dielectric grid 52 underlying the first low-n dielectric grid 51, and a metal grid 53 that is at least partially enclosed by the second low-n dielectric grid 52.

In some embodiments, as shown in FIGS. 6A and 6B, the first isolation structure 150 includes an etch stop film 54 at least partially wrapping the metal grid 53 in the second low-n dielectric grid 52, and thus separating the metal grid 53 from the second low-n dielectric grid 52. The etch stop film 54 is made of a dielectric material such as aluminum oxide (e.g., $Al_2O_3$), silicon nitride, hafnium oxide, zirconium oxide or any other suitable material.

Figure 6D:
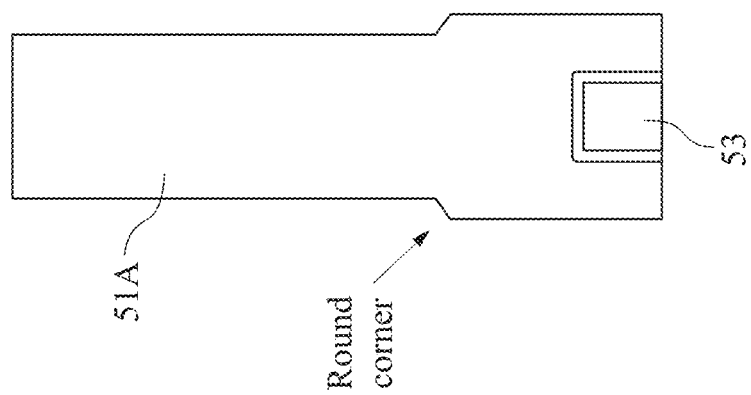
Figure 6C:
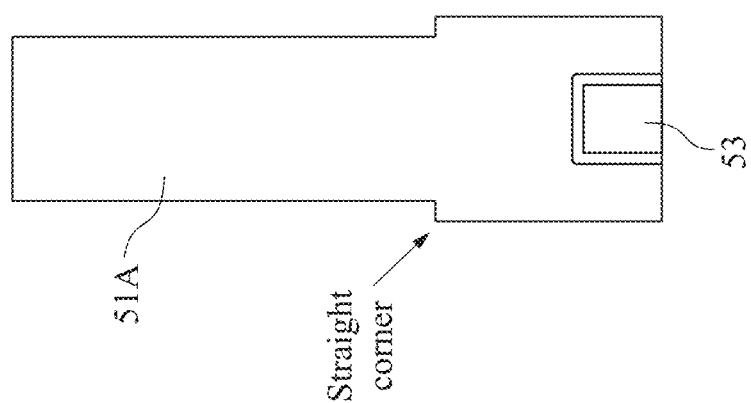
Figure 6E:
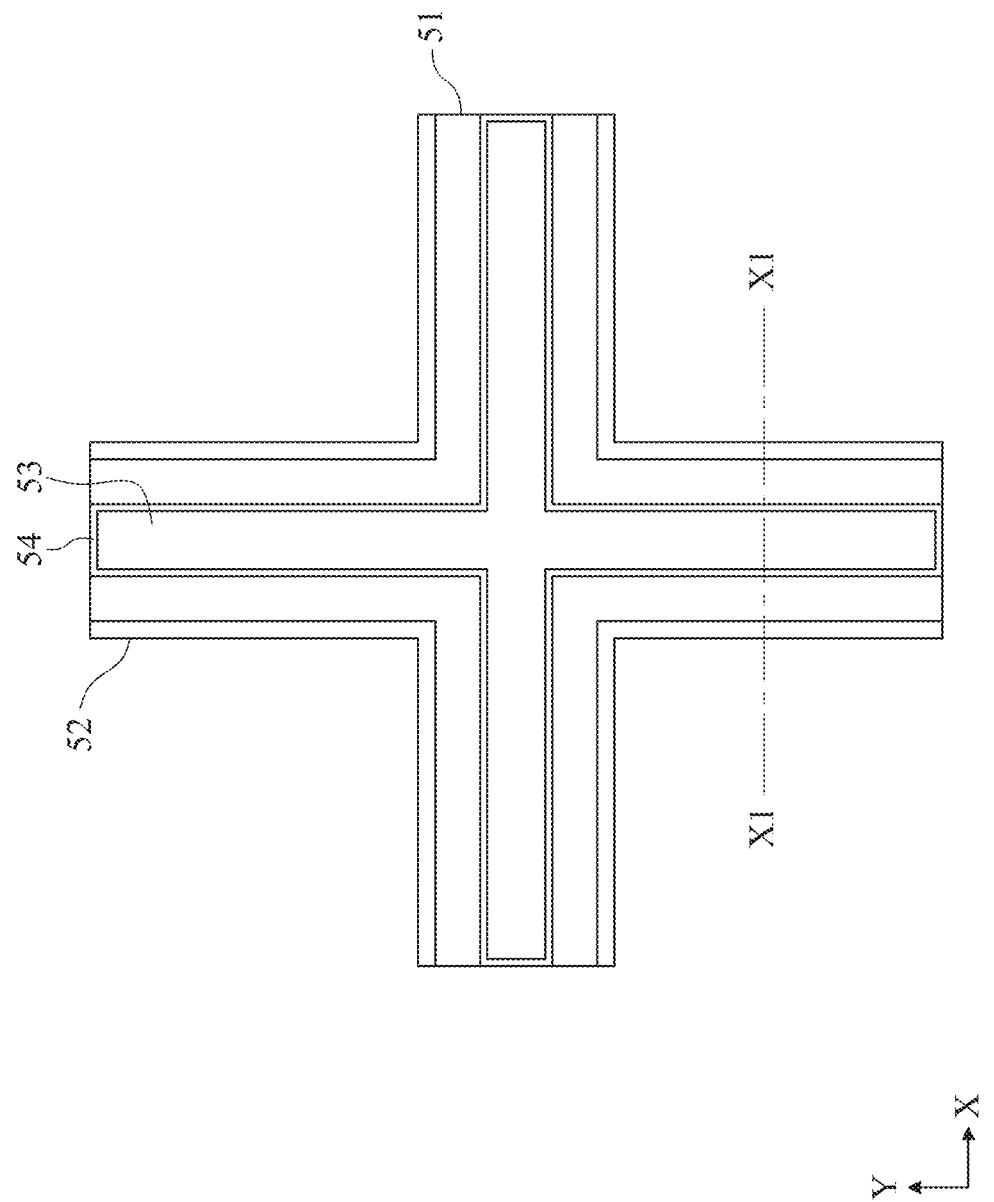
FIG. 6E illustrates a top plan view of the first isolation structure of the CMOS image sensor in accordance with embodiments.

In some embodiments, the materials of the second low-n dielectric grid 52 and the first low-n dielectric grid 51 are different from each other, as shown in FIGS. 6A and 6B. In other embodiments, the first low-n dielectric grid 51 and the second low-n dielectric grid 52 are made of the same material 51A as shown in FIGS. 6C and 6D.

In some embodiments, as shown in FIG. 6A, the second low-n dielectric grid 52 includes a filler dielectric material 55, which is different from the second dielectric material 52. In some embodiments, the filler dielectric material 55 is mixed with the second dielectric material 52, and a total volume of the filler dielectric material 55 is less than a total volume of the second dielectric material 52 in the second low-n dielectric grid 52. In some embodiments, a ratio of the total volume of the filler dielectric material 55 to the total volume of the second dielectric material in the second low-n dielectric grid 52 is in a range from about 20% to about 80%. In some embodiments, a refractive index of the filler dielectric material 55 is different from a refractive index of the second dielectric material 52. In some embodiments, the filler dielectric material 55 includes a dielectric material, such as an oxide material (e.g., silicon oxide and aluminum oxide). In some embodiments, the filler dielectric material 55 is in random sizes. In some embodiments, the filler dielectric material 55 is non-uniform. In some embodiments, the filler dielectric material 55 is in random shapes, including but not limited to, square shapes, rectangular shapes, ball shapes, spherical shapes and elliptical shapes. The fillers 55 function to reduce or even prevent light from penetrating across the second low-n dielectric grid 52 from left to right or from right to left. In some embodiments, the refractive index of the filler dielectric material 55 is in a range greater than 1 and less than 1.5. The filler dielectric material 55 mixed with and disposed in the second dielectric material 52 enhances reflections and primary scatterings of incident light in the pixel channels of the CMOS image sensor, thus improving quantum efficiency (QE) of the CMOS image sensor.

In some embodiments, as shown in FIG. 6B, the first low-n dielectric grid 51 includes a filler dielectric material 55 that is different from the first dielectric material 51. In some embodiments, the filler dielectric material 55 is mixed with the first dielectric material 51, and a total volume of the filler dielectric material 55 is less than a total volume of the first dielectric material 51 in the first low-n dielectric grid 51. In some embodiments, a ratio of the total volume of the filler dielectric material 55 to the total volume of the first dielectric material 51 in the first dielectric material 51 is in a range from about 20% to about 80%. In some embodiments, a refractive index of the filler dielectric material 55 is different from a refractive index of the first dielectric material 51.

In some embodiments, both the first low-n dielectric grid 51 and the second dielectric material 52 include a filler dielectric material 55 that is different from both the first dielectric material 51 and the second dielectric material 52.

In this way, the filler dielectric material 55 can increase reflections and scatterings of the incident light on the first low-n dielectric grid 51 and/or the second low-n dielectric grid 52, and thus, can enhance total internal reflection (TIR) of the first low-n dielectric grid 51 and/or the second low-n dielectric grid 52, accordingly improving quantum efficiency (QE) of the CMOS image sensor 100.

In some embodiments, upper corners of the second low-n dielectric grid 52 are substantially straight cornered as shown in FIGS. 6A and 6C. In other embodiments, the upper corners of the second low-n dielectric grid 52 are rounded as shown in FIGS. 6B and 6D. In some embodiments, a radius of the corner is about 1 nm to about 10 nm.

In some embodiments, the first low-n dielectric grid 51 is made of a dielectric material (such as silicon oxide, e.g., $SiO_2$) or a ceramic material, and the second low-n dielectric grid 52 is made of a dielectric material (e.g., $Al_2O_3$ or $SiO_2$) or a ceramic material. In some embodiments, the metal grid 53 is made of a metal material (such as W, Al, Cu, or Cr, or a metal alloy material (such as TiN)).

The first isolation structure 150 defines spaces or rooms for color filters 40A of the image pixel 105 and PDAF color filters 40B for the PDAF pixels 115 using the first low-n dielectric grid 51 and the second low-n dielectric grid 52. In some embodiments, the color filters 40A of the image pixel 105 and the PDAF color filters 40B are made of an organic or inorganic dielectric material.

In some embodiments, the refractive index n1 of the first low-n dielectric grid 51 is in a range from a value greater than 1 (e.g., 1.01) to about 1.50, that is 1<n1<1.50. In some embodiments, the refractive index n2 of the second low-n dielectric grid 52 is in a range from a value greater than 1 (e.g., 1.01) to about 1.50, that is 1<n2<1.50. In some embodiments, the refractive index n1 of the first low-n dielectric grid 51 is equal to or greater than the refractive index n2 of the second low-n dielectric grid 52, that is n1=n2, or n1>n2.

In some embodiments, both the refractive index n1 of the first low-n dielectric grid 51 and the refractive index n2 of the second low-n dielectric grid 52 of the first isolation structure 150 are less than the refractive index n of the color filters 40' of the color filter array 40, that is n1<n and n2<n. In this way, total internal reflection in the color filters of the pixel image sensor array can be enhanced, and the quantum efficiency (QE) of the pixel image sensor array can thus be improved.

In some embodiments, a first width W1 of the first low-n dielectric grid 51 is in a range from about 50 nm to about 200 nm, and a first height H1 of the first low-n dielectric grid 51 is in a range from about 100 nm to about 1000 nm. In some embodiments, a second width W2 of the second low-n dielectric grid 52 is in a range from about 90 nm to about 300 nm, and a second height H2 of the second low-n dielectric grid 52 is in a range from about 100 nm to about 1000 nm. In some embodiments, a third width W3 of the metal grid 53 is in a range from about 20 nm to about 80 nm, and a third height H3 of the metal grid 53 is in a range from about 30 nm to about 500 nm.

In some embodiments, a first width W1 of the first low-n dielectric grid 51 is less than a second width W2 of the second low-n dielectric grid 52. In some embodiments, a first height H1 of the first low-n dielectric grid 51 is greater than a second height H2 of the second low-n dielectric grid 52. In some embodiments, a ratio of H1 to H2 (H1/H2) is in a range from about 1.2 to about 10. In this way, a space or a room of each color filter 40' in each color filter 40' of the color filter array 40 of the CMOS image sensor 100 can be enlarged, and the quantum efficiency (QE) of each unit pixel of the pixel image sensor array can thus be enhanced.

Figure 7C:
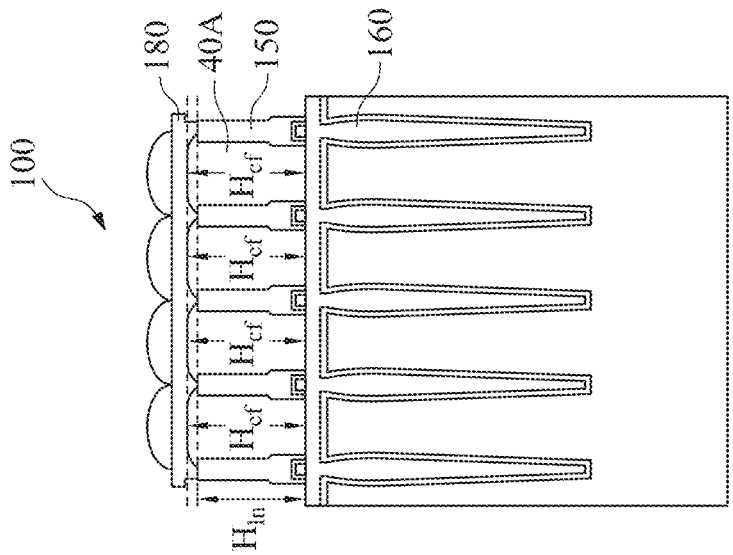
FIGS. 7A, 7B, 7C, 7D, 7E and 7F illustrate cross sectional views of CMOS image sensors having varying color filter heights and isolation grid heights in accordance with embodiments.
Figure 7B:
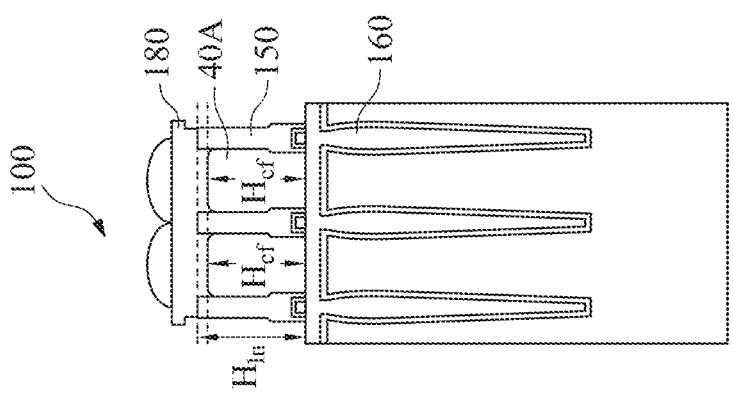
Figure 7A:
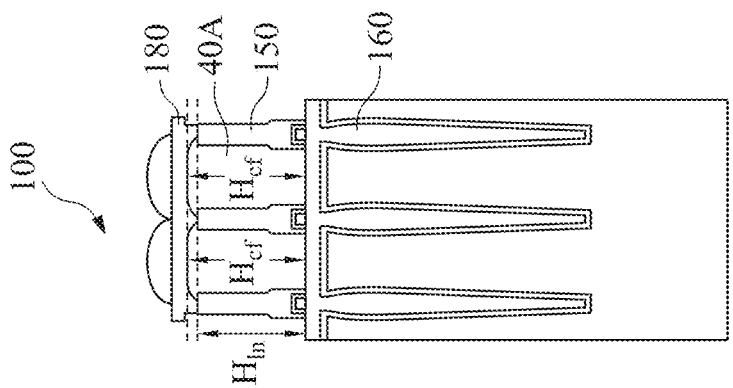
Figures 7D, 7E, 7F:
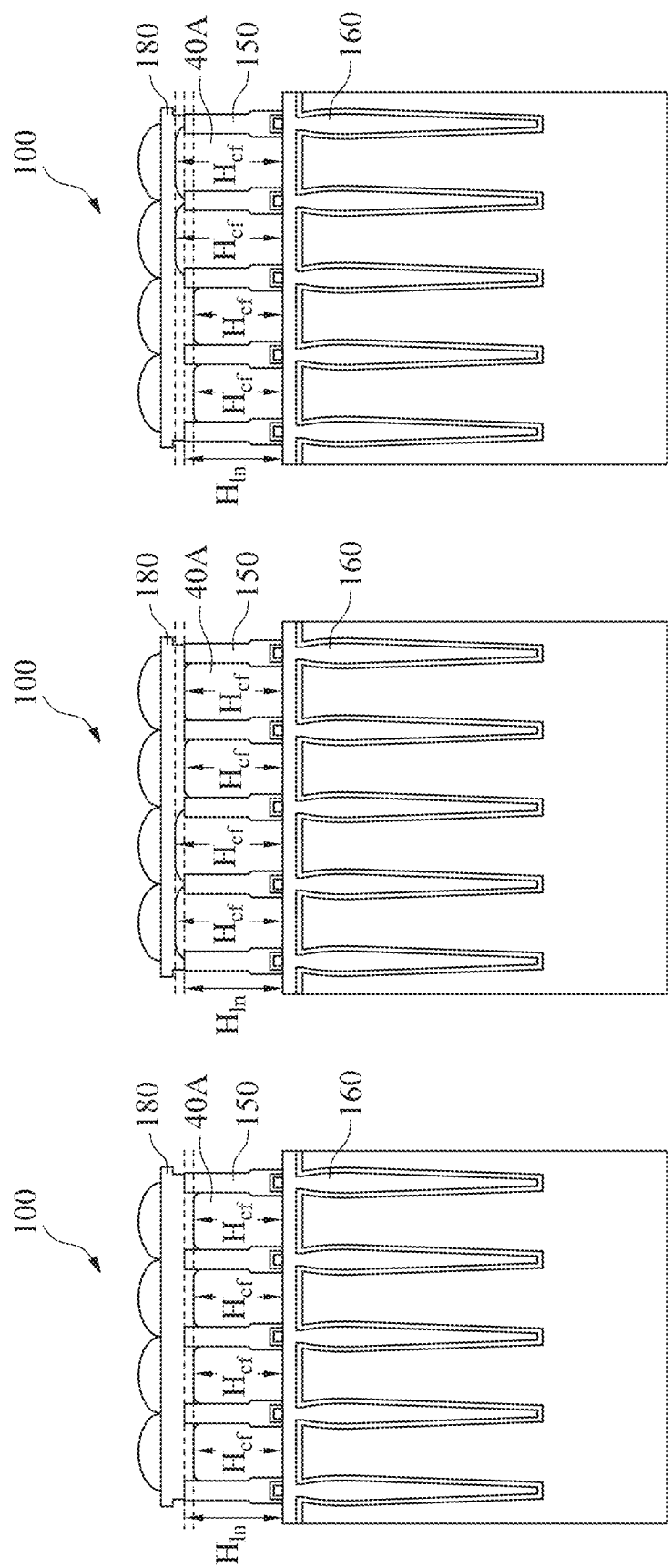

FIGS. 7A-7F illustrate cross sectional views of CMOS image sensors having varying color filter heights $H_{cf}$ and varying first isolation grid heights $H_{in}$ in accordance with embodiments. In some embodiments, the color filter heights $H_{cf}$ affect the thickness of the separation layer (or underlayer) 180 since some color filters 40A extend into the separation layer 180 as shown in FIGS. 7A, 7C, 7E and 7F. In some embodiments, a color filter height $H_{cf}$ is higher than an isolation grid height $H_{in}$ in a CMOS image sensor 100 as shown in FIG. 7A. In some embodiments, a color filter height $H_{cf}$ is lower than an isolation grid height $H_{in}$ in a CMOS image sensor 100 as shown in FIG. 7B. In some embodiments, the color filters 40A of the same color have the same color filter heights $H_{cf}$ in a CMOS image sensor 100 as shown in FIGS. 7A-7F. In some embodiments, the color filters 40A having color filter heights $H_{cf}$ greater than the isolation grid heights $H_{in}$ in a CMOS image sensor 100 extend into the separation layer 180 as shown in FIGS. 7A, 7C, 7E and 7F.

FIGS. 8A and 8B illustrate a second isolation grid structure 160 (such as a DTI) with a bowling pin shaped profile of a CMOS sensor 100. FIG. 8A is a cross sectional view of the CMOS sensor 100 corresponding to line X1-X1 of FIG. 8B. FIG. 8B is top plan view of color filters 40A of the CMOS image sensor 100. As shown in FIGS. 8A and 8B, the DTI 160 extends in the X direction and in the Y direction, and is deeply etched into the substrate 110 in the Z direction. At the intersection spot (or a cross-road spot) 80 of the DTI 160 in the X direction and the Y direction as shown in FIG. 8A, the DTI 160 is etched into the substrate 110 in the Z direction deeper than at any other parts of the DTI 160 beyond the intersection spot 80 as shown in FIG. 8B, and thus the conventional bowling pin shaped DTI 160 has a cross-road pit 81A having a pit depth Dp and a pit width Wp.

Figure 9B:
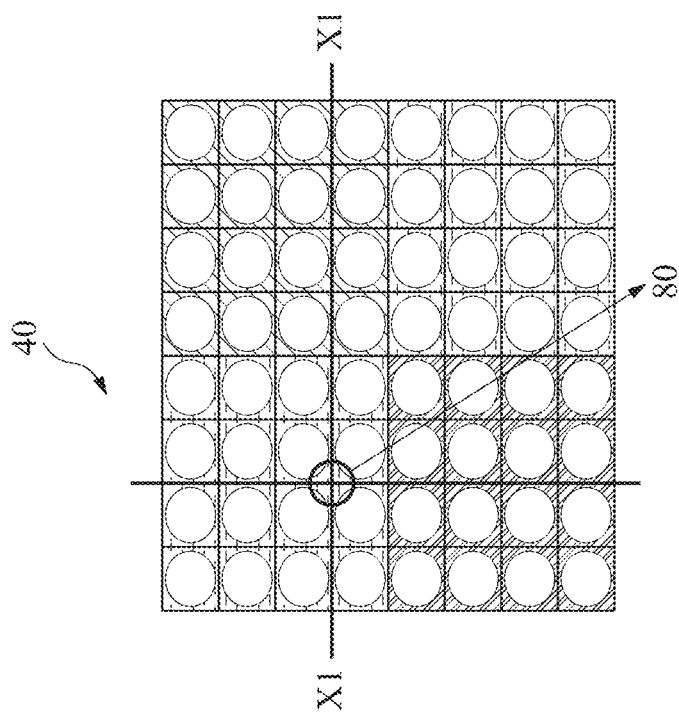
FIGS. 9A and 9B illustrate a second isolation grid structure with a straight or needle-shaped profile in accordance with the embodiments.
Figure 9A:
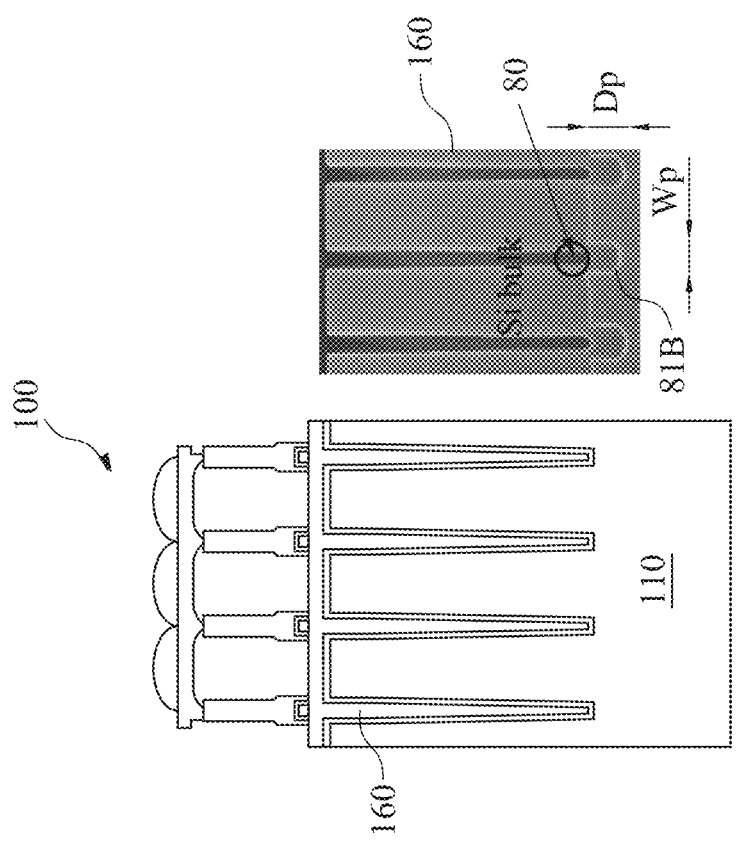

FIGS. 9A and 9B illustrate a second isolation grid structure 160 (such as a DTI) with a straight or needle-shaped profile of a CMOS sensor 100 in accordance with the embodiments. FIG. 9A is a cross sectional view of the CMOS sensor 100 corresponding to line X1-X1 of FIG. 9B. FIG. 9B is top plan view of color filters 40A of the CMOS image sensor 100. As shown in FIGS. 9A and 9B, the DTI 160 extends in the X direction and in the Y direction, and is deeply etched into the substrate 110 in the Z direction. At an intersection spot (or a cross-road spot) 80 of the DTI 160 in the X direction and the Y direction as shown in FIG. 9A, the DTI 160 is etched into the substrate 110 in the Z direction deeper than any other parts of the DTI 160 beyond the intersection spot 80 as shown in FIG. 9B. The straight or needle-shaped DTI 160 has a cross-road pit 81B that is shallower than the cross-road pit 81A in some embodiments. Thus, the cross-road pit 81B of the straight or needle-shaped DTI 160 advantageously has less impact on the electric elements (such as transfer transistors or metal inter-connects) underlying the cross-road pit 81B in the substrate 110 because a distance between the cross-road pit 81B and the electric elements underlying the cross-road pit 81B is greater than a distance between the cross-road pit 81A and the electric elements underlying the cross-road pit 81A. In some embodiments, the depth Dp of the cross-road pit 81B is in a range from about 250 nm to about 450 nm, and a width Wp of the cross-road pit 81B is in a range from about 100 nm to about 200 nm.

In some embodiments, a dry etch process, such as a plasma etching process, is used to form the straight or needle-shaped DTI 160 by controlling and adjusting parameters of the plasma etching process. In the plasma etching process, the transverse control power and the bias power both can be controlled and adjusted in order to form the straight or needle-shaped DTI 160. The transverse control power is lowered and the bias power is enhanced in some embodiments. Due to the short bombardment time period, the cross-road pit 81B of the straight or needle-shaped DTI 160 is advantageously shallower than the cross-road pit 81A of the bowling pin shaped DTI 160.

According to embodiments of the present disclosure, a CMOS image sensor includes a plurality of PDAF pixels distributed in an array of pixel sensors in plan view. Each PDAF pixel includes m×m binned photodiodes, a PDAF color filter overlying the binned photodiodes and laterally surrounded by a first isolation structure, and a PDAF micro-lens overlying the PDAF color filter. A first horizontal distance between a center of gravity of the PDAF color filter and a center of gravity of the binned photodiodes varies depending on a location of the PDAF pixel in plan view in the CMOS image sensor. A second horizontal distance between a center of gravity of the PDAF micro-lens and the center of gravity of the PDAF color filter in plan view varies depending on the location of the PDAF pixel in the CMOS image sensor. The global shifts of the PDAF color filters and the PDAF micro-lenses advantageously improve the uniformity of the CMOS image sensor.

Additionally, the first isolation structure in a color filter layer of the CMOS image sensor includes a first low-n dielectric grid, a second low-n dielectric grid underlying the first low-n dielectric grid, and a metal grid at least partially enclosed by the second low-n dielectric grid. The second low-n dielectric grid includes a filler dielectric material different from and mixed with a second low-n dielectric grid material. The first isolation structure enhances the total internal reflections of the incident lights in pixel channels of the CMOS image sensor, and thus, advantageously increases quantum efficiency (QE) of the CMOS image sensor.

In accordance with an aspect of the present disclosure, a CMOS image sensor includes a photodiode array in a photodiode layer and disposed in a semiconductor substrate; a color filter array in a color filter layer and overlying photodiode array; a micro-lens array in a micro-lens layer and overlying the color filter array; and a first isolation structure disposed in the color filter layer to laterally separate adjacent color filters, and including a first low refractive index (low-n) dielectric grid of a first dielectric material, a second low-n dielectric grid of a second dielectric material and underlying the first low-n dielectric grid, and a metal grid at least partially enclosed by the second low-n dielectric grid. The second low-n dielectric grid includes a filler dielectric material different from and mixed with the second dielectric material. A total volume of the filler dielectric material is less than a total volume of the second dielectric material in the second low-n dielectric grid. A refractive index of the filler dielectric material is different from a refractive index of the second dielectric material. In one or more of the foregoing and/or following embodiments, the filler dielectric material includes an oxide material. The filler dielectric material is in random shapes. In one or more of the foregoing and/or following embodiments, refractive indexes of the first and the second low-n dielectric grids are less than the refractive index of the color filter cells, and the refractive indexes of the first and the second low-n dielectric grids and the filler dielectric material are in a range greater than 1 and less than 1.5. In one or more of the foregoing and/or following embodiments, the first low-n dielectric grid includes another filler dielectric material different from and mixed with the first dielectric material. A total volume of the another filler dielectric material is less than a total volume of the first dielectric material in the first low-n dielectric grid, and a refractive index of the another filler dielectric material is different from a refractive index of the first dielectric material. In one or more of the foregoing and/or following embodiments, a first width of the first low-n dielectric grid is less than a second width of the second low-n dielectric grid. In one or more of the foregoing and/or following embodiments, the metal grid is at least partially wrapped by a dielectric etch stop film to separate the metal grid from the second low-n dielectric grid, and the metal grid is made of a metal material or a metal alloy material. In one or more of the foregoing and/or following embodiments, the CMOS image sensor further includes a separation layer separating the micro-lens layer and the color filter layer. In one or more of the foregoing and/or following embodiments, the CMOS image sensor further includes a second isolation structure disposed in the semiconductor substrate to laterally separate adjacent photodiodes. In one or more of the foregoing and/or following embodiments, the second isolation structure includes a deep trench isolation grid having a needle shaped or rectangular profile. In one or more of the foregoing and/or following embodiments, the CMOS image sensor further includes a plurality of phase detection auto-focusing (PDAF) pixels. Each PDAF pixel includes m×m binned photodiodes, a PDAF color filter disposed in the color filter layer and overlying the m×m binned photodiodes, and a PDAF micro-lens disposed in the micro-lens layer and overlying the PDAF color filter. The first isolation structure laterally separates the PDAF color filter from adjacent color filters of the color filter array.

In accordance with an aspect of the present disclosure, a CMOS image sensor includes: an array of image pixels, each image pixel including: a photodiode surrounded by a photodiode isolation structure in a photodiode layer, a color filter overlying the photodiode and surrounded by a color filter isolation structure in a color filter layer, and a micro-lens overlying the color filter in a micro-lens layer; and a plurality of phase detection auto-focusing (PDAF) pixels distributed in the array of image pixels in plan view, each PDAF pixel including: m×m binned photodiodes in the photodiode layer, a PDAF color filter overlying the m×m binned photodiodes and surrounded by the color filter isolation structure in the color filter layer, and a PDAF micro-lens overlying the PDAF color filter. A first horizontal distance between a center of gravity of the PDAF color filter and a center of gravity of the m×m binned photodiodes varies depending on a location of the PDAF pixel in the CMOS image sensor. In one or more of the foregoing and/or following embodiments, in an edge region of the CMOS image sensor, the first horizontal distance between the center of gravity of the PDAF color filter and the center of gravity of the m×m binned photodiodes gradually increases in a first direction in plan view from a center of the CMOS image sensor to an edge of the edge region. In one or more of the foregoing and/or following embodiments, a second horizontal distance between a center of gravity of the PDAF micro-lens and the center of gravity of the PDAF color filter in horizontal plan view varies depending on the location of the PDAF pixel in the CMOS image sensor. In one or more of the foregoing and/or following embodiments, in an edge region of the CMOS image sensor, the second horizontal distance the center of gravity of the PDAF micro-lens and the center of gravity of the PDAF color filter gradually increases in a first direction in plan view from a center of the CMOS image sensor to an edge of the edge region. In one or more of the foregoing and/or following embodiments, a ratio of a photodiode coverage by the plurality of PDAF pixels to a total photodiode coverage by the CMOS image sensor is in a range from about 4% to about 10%.

In accordance with an aspect of the present disclosure, a CMOS image sensor includes: a plurality of phase detection auto-focusing (PDAF) pixels distributed in an array of image pixels in plan view, each PDAF pixel including: m×m binned photodiodes in a photodiode layer, a PDAF color filter overlying the m×m binned photodiodes and surrounded by a color filter isolation structure in a color filter layer, and a PDAF micro-lens overlying the PDAF color filter in a micro-lens layer. A first horizontal distance between a center of gravity of the PDAF color filter and a center of gravity of the m×m binned photodiodes varies depending on a location of the PDAF pixel in the CMOS image sensor. In one or more of the foregoing and/or following embodiments, in an edge region of the CMOS image sensor, the first horizontal distance between the center of gravity of the PDAF color filter and the center of gravity of the m×m binned photodiodes gradually increases in a first direction in plan view from a center of the CMOS image sensor to an edge of the edge region. In one or more of the foregoing and/or following embodiments, a second horizontal distance between a center of gravity of the PDAF micro-lens and the center of gravity of the PDAF color filter in horizontal plan view varies depending on the location of the PDAF pixel in the CMOS image sensor. In one or more of the foregoing and/or following embodiments, in an edge region of the CMOS image sensor, the second horizontal distance the center of gravity of the PDAF micro-lens and the center of gravity of the PDAF color filter gradually increases in a first direction in plan view from a center of the CMOS image sensor to an edge of the edge region. In one or more of the foregoing and/or following embodiments, a ratio of a photodiode coverage by the plurality of PDAF pixels to a total photodiode coverage by the CMOS image sensor is in a range from about 4% to about 10%.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed:

1. A CMOS image sensor comprising:
   a photodiode array in a photodiode layer disposed in a semiconductor substrate;
   a color filter array in a color filter layer overlying the photodiode array;
   a micro-lens array in a micro-lens layer overlying the color filter array; and
   a first isolation structure disposed in the color filter layer laterally separating adjacent color filters, and comprising a first low refractive index (low-n) dielectric grid of a first dielectric material, a second low-n dielectric grid of a second dielectric material underlying the first low-n dielectric grid, and a metal grid at least partially enclosed by the second low-n dielectric grid,
   wherein the second low-n dielectric grid comprises a filler dielectric material different from and mixed with the second dielectric material, wherein a total volume of the filler dielectric material is less than a total volume of the second dielectric material in the second low-n dielectric grid, and wherein a refractive index of the filler dielectric material is different from a refractive index of the second dielectric material.

2. The CMOS image sensor of claim 1, wherein the filler dielectric material comprises an oxide material, and wherein the filler dielectric material is randomly shaped.

3. The CMOS image sensor of claim 1, wherein refractive indexes of the first and the second low-n dielectric grids are less than the refractive index of the color filter cells, and wherein the refractive indexes of the first and the second low-n dielectric grids and the filler dielectric material are in a range greater than 1 and less than 1.5.

4. The CMOS image sensor of claim 1, wherein the first low-n dielectric grid comprises another filler dielectric material different from and mixed with the first dielectric material, wherein a total volume of the another filler dielectric material is less than a total volume of the first dielectric material in the first low-n dielectric grid, and wherein a refractive index of the another filler dielectric material is different from a refractive index of the first dielectric material.

5. The CMOS image sensor of claim 1, wherein a first width of the first low-n dielectric grid is less than a second width of the second low-n dielectric grid.

6. The CMOS image sensor of claim 1, wherein the metal grid is at least partially wrapped by a dielectric etch stop film separating the metal grid from the second low-n dielectric grid, and wherein the metal grid is made of a metal material or a metal alloy material.

7. The CMOS image sensor of claim 1, further comprising a separation layer separating the micro-lens layer and the color filter layer.

8. The CMOS image sensor of claim 1, further comprising a second isolation structure disposed in the semiconductor substrate laterally separating adjacent photodiodes.

9. The CMOS image sensor of claim 8, wherein the second isolation structure comprises a deep trench isolation (DTI) grid having a needle shaped or rectangular profile.

10. The CMOS image sensor of claim 1, further comprising a plurality of phase detection auto-focusing (PDAF) pixels, wherein each PDAF pixel comprises:

m×m binned photodiodes, m being an integer equal to or greater than 2,
a PDAF color filter disposed in the color filter layer and overlying the 2×2 binned photodiodes, and
a PDAF micro-lens disposed in the micro-lens layer and overlying the PDAF color filter,
wherein the first isolation structure laterally separates the PDAF color filter from adjacent color filters of the color filter array.

11. A CMOS image sensor, comprising:
an array of image pixels, wherein each image pixel comprises:
   a photodiode surrounded by a photodiode isolation structure in a photodiode layer,
   a color filter overlying the photodiode and surrounded by a color filter isolation structure in a color filter layer, and
   a micro-lens overlying the color filter in a micro-lens layer; and
a plurality of phase detection auto-focusing (PDAF) pixels distributed in the array of image pixels in plan view, wherein each PDAF pixel comprises:
   m×m binned photodiodes in the photodiode layer, m being an integer equal to or greater than 2,
   a PDAF color filter overlying the m×m binned photodiodes and surrounded by the color filter isolation structure in the color filter layer, and
   a PDAF micro-lens overlying the PDAF color filter,
wherein a first horizontal distance between a center of gravity of the PDAF color filter (40B) and a center of gravity of the m×m binned photodiodes varies depending on a location of the PDAF pixel in the CMOS image sensor.

12. The CMOS image sensor of claim 11, wherein in an edge region of the CMOS image sensor, the first horizontal distance between the center of gravity of the PDAF color filter and the center of gravity of the 2×2 binned photodiodes gradually increases in a first direction in plan view from a center of the CMOS image sensor to an edge of the edge region.

13. The CMOS image sensor of claim 11, wherein a second horizontal distance between a center of gravity of the PDAF micro-lens and the center of gravity of the PDAF color filter in horizontal plan view varies depending on the location of the PDAF pixel in the CMOS image sensor.

14. The CMOS image sensor of claim 13, wherein in an edge region of the CMOS image sensor, the second horizontal distance the center of gravity of the PDAF micro-lens and the center of gravity of the PDAF color filter gradually increases in a first direction in plan view from a center of the CMOS image sensor to an edge of the edge region.

15. The CMOS image sensor of claim 11, wherein a ratio of a photodiode coverage by the plurality of PDAF pixels to a total photodiode coverage by the CMOS image sensor is in a range from about 4% to about 10%.

16. A CMOS image sensor comprising:
a plurality of phase detection auto-focusing (PDAF) pixels distributed in an array of image pixels in plan view, wherein each PDAF pixel comprises:
   m×m binned photodiodes in a photodiode layer, m being an integer equal to or greater than 2,
   a PDAF color filter overlying the m×m binned photodiodes and surrounded by a color filter isolation structure in a color filter layer, and
   a PDAF micro-lens overlying the PDAF color filter in a micro-lens layer,
wherein a first horizontal distance between a center of gravity of the PDAF color filter and a center of gravity of the m×m binned photodiodes varies depending on a location of the PDAF pixel in the CMOS image sensor.

17. The CMOS image sensor of claim 16, wherein in an edge region of the CMOS image sensor, the first horizontal distance between the center of gravity of the PDAF color filter and the center of gravity of the 2×2 binned photodiodes gradually increases in a first direction in plan view from a center of the CMOS image sensor to an edge of the edge region.

18. The CMOS image sensor of claim 16, wherein a second horizontal distance between a center of gravity of the PDAF micro-lens and the center of gravity of the PDAF color filter in horizontal plan view varies depending on the location of the PDAF pixel in the CMOS image sensor.

19. The CMOS image sensor of claim 18, wherein in an edge region of the CMOS image sensor, the second horizontal distance the center of gravity of the PDAF micro-lens and the center of gravity of the PDAF color filter gradually increases in a first direction in plan view from a center of the CMOS image sensor to an edge of the edge region.

20. The CMOS image sensor of claim 16, wherein a ratio of a photodiode coverage by the plurality of PDAF pixels to a total photodiode coverage by the CMOS image sensor is in a range from about 4% to about 10%.

* * * * *